United States Patent
Yamamoto et al.

(10) Patent No.: US 8,129,846 B2
(45) Date of Patent: Mar. 6, 2012

(54) BOARD ADAPTED TO MOUNT AN ELECTRONIC DEVICE, SEMICONDUCTOR MODULE AND MANUFACTURING METHOD THEREFOR, AND PORTABLE DEVICE

(75) Inventors: Tetsuya Yamamoto, Hashima (JP); Yoshio Okayama, Gifu (JP); Yasuyuki Yanase, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/266,907

(22) Filed: Nov. 7, 2008

(65) Prior Publication Data
US 2009/0121350 A1 May 14, 2009

(30) Foreign Application Priority Data

Nov. 8, 2007 (JP) .................................. 2007-291342
Oct. 23, 2008 (JP) .................................. 2008-273591

(51) Int. Cl.
*H01L 23/48* (2006.01)
*H01L 23/52* (2006.01)
*H01L 29/40* (2006.01)

(52) U.S. Cl. ................................ 257/778; 257/E23.021
(58) Field of Classification Search ................ 257/778, 257/737, 738, 731, 733, 772, 773, 774, 782, 257/784, 786, 779, 758, E23.015, E23.02, 257/E23.021, E23.068, E21.575
See application file for complete search history.

(56) References Cited

U.S. PATENT DOCUMENTS

| 6,674,162 B2 * | 1/2004 | Takao | 257/700 |
| 2007/0059919 A1 * | 3/2007 | Ooka | 438/618 |

FOREIGN PATENT DOCUMENTS

| JP | 08-111574 | 4/1996 |
| JP | 2004-193297 | 7/2004 |
| JP | 2006-173463 | 6/2006 |

OTHER PUBLICATIONS

Japanese Notification of Reasons for Refusal, with English Translation, issued in Japanese Patent Application No. 2008-273591, mailed Oct. 5, 2010.

\* cited by examiner

*Primary Examiner* — A. Sefer
*Assistant Examiner* — Dilinh Nguyen
(74) *Attorney, Agent, or Firm* — McDermott Will & Emery LLP

(57) ABSTRACT

A board adapted to mount an electronic device includes an insulating resin layer, a wiring layer of a predetermined pattern provided on one surface of the insulating resin layer, a bump electrode provided on an insulating-resin-layer-side surface of the wiring layer, and a covering, formed of a metal layer, which covers a top surface of the bump electrode and a region, at a side surface of the bump electrode, continuous with the top surface excluding a region in contact with the wiring layer.

7 Claims, 26 Drawing Sheets

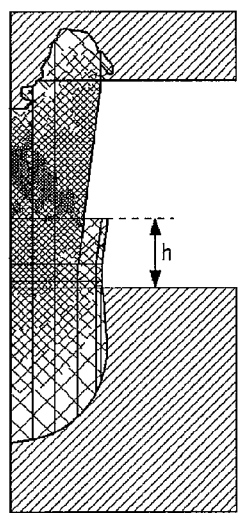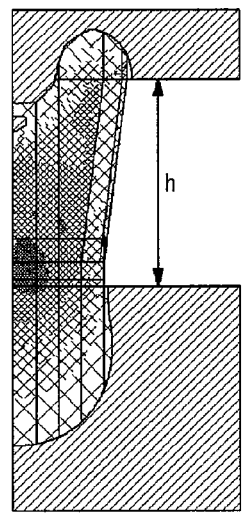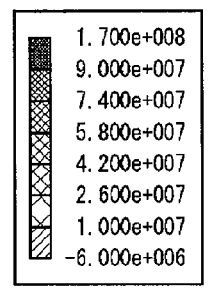
FIG.6A  FIG.6B

BOARD ADAPTED TO MOUNT AN ELECTRONIC DEVICE, SEMICONDUCTOR MODULE AND MANUFACTURING METHOD THEREFOR, AND PORTABLE DEVICE

CROSS-REFERENCE TO RELATED APPLICATIONS

This application is based upon and claims the benefit of priority from the prior Japanese Patent Applications No. 2007-291342, filed Nov. 8, 2007, and Japanese Patent Application No. 2008-273591, filed Oct. 23, 2008, the entire contents of which are incorporated herein by reference.

BACKGROUND OF THE INVENTION

1. Field of the Invention

The present invention relates to a board adapted to mount an electronic device, a semiconductor module and a manufacturing method therefor, and a portable device.

2. Description of the Related Art

In recent years, with miniaturization and higher performance in electronic devices, demand has been ever greater for further miniaturization of semiconductor devices used in the electronic devices. With such miniaturization of semiconductor devices, it is of absolute necessity that the pitch of electrodes to enable mounting on a board adapted to mount an electronic device be made narrower. A known method of surface-mounting a semiconductor device is flip-chip mounting in which solder bumps are formed on electrodes of the semiconductor device and the solder bumps are soldered to an electrode pad of the board adapted to mount an electronic device. With this flip-chip method, however, there are restrictive factors for the narrowing of the pitch of electrodes, such as the size of the solder bump itself and the bridge formation at soldering. As one structure used to overcome these limitations, known is a structure where a bump structure formed on a substrate is used as an electrode or a via, and the electrodes of the semiconductor device are connected to the bump structure by mounting the semiconductor device on a substrate by interposing an insulating resin, such as epoxy resin, between the semiconductor device and the substrate.

In a structure having a bump structure provided on electrodes of a packaging board adapted to mount an electronic device and a semiconductor device so mounted on the board that the bump structure and the electrodes of the semiconductor device are connected, known is another structure used to improve the connection reliability between the bump structure and the electrodes of the semiconductor device by coating or covering the electrodes of the board and the bump structure with a metal plating layer.

As described in each of the above-described conventional structures, in the structure where the board and the semiconductor device are stacked together by press-bonding the bump structure provided on the electrodes of the board and the electrodes of the semiconductor device, a stress caused by the change in temperature of its environment is concentrated at the interface between the bump structure and the electrodes of the semiconductor device. As a result, the stress may cause damage to the electrodes of the semiconductor device. The reliability of connection between the bump structure and the electrodes of the semiconductor device drops when the electrodes of the semiconductor device are actually damaged.

SUMMARY OF THE INVENTION

The present invention has been made in view of the foregoing circumstances, and a general purpose thereof is to provide a technology for reducing the possibility of damaging the electrodes of a semiconductor device and improving the connection reliability between the bump structure and the electrodes of a semiconductor device in a semiconductor module which is formed by stacking a wiring layer, an insulating resin and a semiconductor device in such a manner that the bump structure is embedded in the insulating resin.

In order to solve the foregoing problems, one embodiment of the present invention relates to a board adapted to mount an electronic device. This board adapted to mount an electronic device comprises: an insulating resin layer; a wiring layer provided on one surface of the insulating resin layer; a bump electrode provided on an insulating-resin-layer-side surface of the wiring layer; and a covering, formed of a metal layer, which covers a top surface of the bump electrode and a region, at a side surface thereof, continuous with the top surface thereof excluding a region in contact with the wiring layer.

By employing this embodiment, the stress caused at the interface between the covering and the element electrode due to a change in temperature is dispersed under conditions where the semiconductor device is mounted on the board. As a result, the possibility of damaging the electrodes of the semiconductor device is reduced and the connection reliability between the covering and element electrode is improved.

In the above-described embodiment, the board may further comprises another covering, formed of a metal layer, which is discontinuous across the covering and at least covers a part, extending from a base, including the base at which the side surface of the bump electrode is in contact with the surface of the wiring layer.

In the above-described embodiment, the metal layer may have a yield stress which is greater than 40% of the yield stress of the bump electrode and less than or equal to 100% of that of the bump electrode.

In the above-described embodiment, the metal layer may have a yield stress which is greater than or equal to 50% of the yield stress of the bump electrode and less than or equal to 75% of that of the bump electrode, and the covering may cover a region occupying less than or equal to one half of the height of the bump electrode from the top surface thereof to a surface of the wiring layer at a side thereof where the bump electrode is provided.

Another embodiment of the present invention relates also to a board adapted to mount an electronic device. This board comprises: an insulating resin layer; a wiring layer provided on one surface of said insulating resin layer; and a bump electrode provided on an insulating-resin-layer-side surface of the wiring layer, wherein the bump electrode has a first stepped portion on the side surface thereof such that the bump electrode at a wiring layer side is thinner.

By employing this embodiment, the stress caused at the interface between the covering and the element electrode due to a change in temperature is dispersed by the presence of the stepped portion under conditions where the semiconductor device is mounted on the board. As a result, the possibility of damaging the electrodes of the semiconductor device is reduced and the connection reliability between the bump electrode and the electrode of the semiconductor device is improved.

In the above-described embodiment, the bump electrode may have a second stepped portion, disposed at a wiring layer side closer than the first stepped portion, such that the second stepped portion is thicker and extends to the wiring layer.

Still another embodiment of the present invention relates to a semiconductor module. This semiconductor module comprises: a board according to any of the above-described embodiments; a semiconductor device including an element electrode disposed counter to the bump electrode of the board; and an insulating resin layer provided between the wiring layer and the semiconductor device, wherein the bump electrode penetrates the insulating resin layer, and the bump electrode and the element electrode are electrically connected to each other.

In the above-described embodiment, the insulating resin layer may develop plastic flow when pressurized.

Still another embodiment of the present invention relates to a method for manufacturing a semiconductor module. This method for manufacturing a semiconductor module includes: a process of preparing a metal sheet where a bump electrode is provided; a covering process of covering a top surface of said bump electrode and a region, at a side surface thereof, continuous with the top surface thereof excluding a region in contact with the metal sheet, by using a metal; and a press-bonding process of electrically connecting the bump electrode and an element electrode by press-bonding the metal sheet, where the bump electrode is formed, and a semiconductor device, where the element electrode corresponding to the bump electrode is provided, by way of an insulating resin layer and causing the bump electrode to penetrate the insulating resin layer; and a process of forming a wiring layer by selectively removing the metal sheet.

Still another embodiment of the present invention relates also to a method for manufacturing a semiconductor module. This method for manufacturing a semiconductor module includes: a process of preparing a metal sheet where a bump electrode is provided; a covering process of covering a top surface of said bump electrode and a region, at a side surface thereof, continuous with the top surface thereof excluding a region in contact with the metal sheet, by using a metal; a stacking process of stacking an insulating resin layer on the metal sheet, where the bump electrode is provided, in such a manner that the metal covering the bump electrode is exposed; a press-bonding process of electrically connecting the bump electrode and an element electrode by press-bonding a semiconductor device, where the element electrode corresponding to the bump electrode is provided, to the metal sheet on which the insulating resin layer is stacked; and a process of forming a wiring layer by selectively removing the metal sheet.

In the covering process of the above-described embodiment, the metal may have a yield stress which is greater than 40% of the yield stress of the bump electrode and less than or equal to 100% of that of the bump electrode.

In the covering process of the above-described embodiment, the metal may have a yield stress which is greater than or equal to 50% of the yield stress of the bump electrode and less than or equal to 75% of that of the bump electrode, and the metal may cover a region occupying less than or equal to one half of the height of the bump electrode from the top surface thereof to a surface of the wiring layer at a side thereof where the bump electrode is provided.

In the above-described embodiment, the insulating resin layer may develop plastic flow when pressurized.

Still another embodiment of the present invention relates to a portable device which mounts a semiconductor module according to any of the above-described embodiments.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which:

FIGS. 6A and 6B are schematic diagrams showing changes in stress distribution due to temperature change;

DETAILED DESCRIPTION OF THE INVENTION

Figure 1:
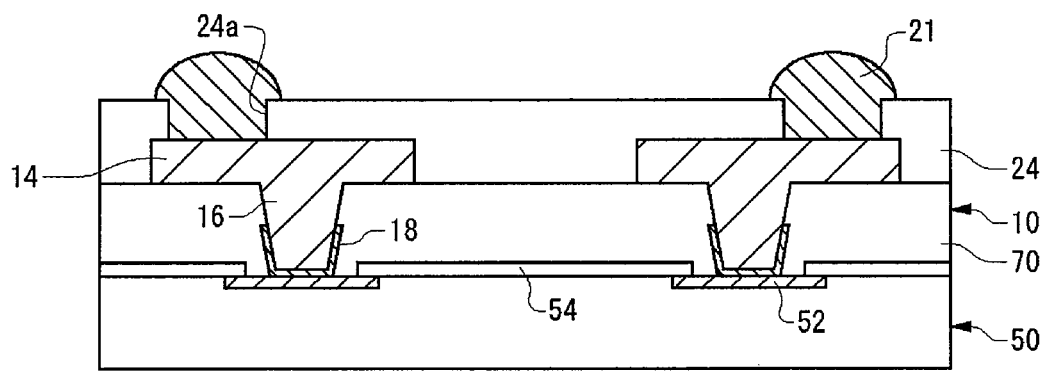
FIG. 1 is a schematic cross-sectional view showing a structure of a board and a semiconductor module according to a first embodiment of the present invention.

The invention will now be described by reference to the preferred embodiments. This does not intend to limit the scope of the present invention, but to exemplify the invention.

The embodiments will now be described with reference to drawings. Note that in all of the Figures the same components, parts and processings are given the same reference numerals and the repeated description thereof is omitted as appropriate. Moreover, the embodiments given are for illustrative purposes only and all features and their combination thereof described in the present embodiment are not necessarily essential to the invention.

First Embodiment

FIG. 1 is a schematic cross-sectional view illustrating a structure of a board adapted to mount an electronic device 10 according to first embodiment of the present invention and that of a semiconductor module 30 using said board 10. The semiconductor module 30 is comprised of a board adapted to mount an electronic device 10 and a semiconductor device 50 mounted on the board 10. It is to be noted that in the embodiments described hereinbelow, a "board adapted to mount an electronic device 10" is referred to as "packaging board 10" or simply as "board 10" also.

The board 10 includes an insulating resin layer 70, a wiring layer 14 provided on one face of the insulating resin layer 70, a bump electrode 16 provided on a surface of the wiring layer 14 on an insulating resin layer 70 side thereof, and a covering 18 which covers or coats a top surface of the bump electrode 16 and a region, at a side surface thereof, continuous with the top surface thereof excluding a region in contact with the wiring layer 14.

The insulating resin layer 70 is made of a material that develops plastic flow when pressurized. An example of the material that develops plastic flow when pressurized is epoxy thermosetting resin. The epoxy thermosetting resin to be used for the insulating resin layer 70 may be, for example, one having viscosity of 1 kPa·s under the conditions of a temperature of 160° C. and a pressure of 8 MPa. If a pressure of 5 to 15 MPa is applied to this epoxy thermosetting resin at a temperature of 160° C., then the viscosity of the resin will drop to about ⅛ of the viscosity thereof with no pressurization. In contrast to this, an epoxy resin in B stage before thermosetting has no viscosity, similarly to a case when the resin is not pressurized, under a condition that the temperature is less than or equal to a glass transition temperature Tg. And the epoxy resin develops no viscosity even when pressurized under a condition that the temperature is less than or equal to a glass transition temperature Tg.

In the semiconductor module 30 according to the first embodiment, the insulating resin layer 70 is provided between the wiring layer 14 and the semiconductor device 50. One face of the insulating resin layer 70 is press-bonded to the wiring layer 14 whereas the other face thereof is press-bonded to the semiconductor device 50. A material that develops plastic flow when pressured is used for the insulating resin layer 70 in the present embodiment. As a result, when the packaging board 10, the insulating resin layer 70, and the semiconductor device 50 are press-bonded in this order and united into one body, the probability that a residual film of insulating resin layer 70 will stay on at an interface between a covering 18 and an element electrode 52 is suppressed. Hence, the connection reliability is improved.

The wiring layer 14 is formed by a conductive material, preferably a rolled metal or more preferably by a rolled copper. A wiring protective layer 24 is provided on a surface of the insulating resin layer 70 opposite to the wiring layer 14. This wiring protective layer 24 protects the wiring layer 14 against oxidation or the like. The wiring protective layer 24 is formed of a photo solder resist, for instance. An opening 24a is formed in a predetermined position of the wiring protective layer 24 so that the wiring layer 14 is exposed. And a solder bump 21 is formed on the wiring layer 14 thus exposed in the opening 24a. The position of the opening 24a, namely, the position in which the solder bump 21 is formed is, for instance, a targeted position where circuit wiring is extended through a rewiring.

In the wiring layer 14, the bump electrodes 16 are provided in positions corresponding respectively to the element electrodes 52 of the semiconductor device 50. In the first embodiment, the wiring layer 14 and the bump electrode 16 are formed integrally with each other. The planar view of the bump electrode 16 is a round shape, and the bump electrode has a side surface which is shaped with a diameter smaller toward a head portion. However, the shape of the bump electrode 16 is not limited to any particular shape and may be, for instance, in the shape of a cylinder with a predetermined diameter. Also, the bump electrode 16 may be polygonal, such as quadrangular, when viewed planarly.

The covering 18 is provided on the top surface of the bump electrode 16 and on a region, at a side surface thereof, continuous with the top surface thereof excluding a region in contact with the wiring layer 14. More specifically, the covering 18 is a metal plating layer which is formed, by electrolytic plating or electroless plating, using a metal material having a yield stress which is, for example, greater than 40% of the yield stress of the bump electrode 16 and less than or equal to 100% of that of the bump electrode. Or the covering 18 may be a conductive paste layer formed using a conductive paste. The metal layer may be multilayered and may be stacked with a Ni plating layer and an Au plating layer, for example. In the first embodiment, such layers are a Ni/Au plating layer formed of gold (Au) and nickel (Ni) having 60% of the yield stress relative to the yield stress of the bump electrode 16 formed of copper.

If the bump electrode 16 and the covering 18 are formed of the same material, the bump electrode 16 and the covering 18 may be formed integrally with each other. In such a case, the bump electrode 16 is of a shape having a stepped portion on the side surface thereof such that the stepped portion on a wiring layer 14 side is thinner.

In the first embodiment, the covering 18 covers or coats the top surface of the bump electrode 16 and a top-surface-side region of each side surface which is less than or equal to one half of the height of the bump electrode 16 measured from the top surface thereof to a surface of the wiring layer 14 where the bump electrode 16 is provided. Here, if one surface of the wiring layer 14 where the bump electrode is provided, namely the surface thereof which serves as one of reference surfaces for the height of the bump electrode 16, has fine roughness or fine asperities on the wiring layer 14, the surface thereof will be defined to be a surface that passes through the average height of these fine asperities, for instance. Similarly, if the top surface of the bump electrode 16, which serves as the other reference surface for the height of the bump electrode 16, has fine asperities thereon, the top surface thereof will be defined to be a surface that passes through the average height of these fine asperities.

The bump electrode 16 penetrates an insulating resin layer 70 and is electrically connected to an element electrode 52 provided in the semiconductor device 50. With the provision of the covering 18 on the bump electrode 16, the stress caused at the interface between the covering 18 and the element electrode 52 due to a change in temperature is dispersed under conditions where the semiconductor device 50 is mounted on the board 10. That is, the value of the maximum stress acting on the element electrode 52 can be reduced. As a result, the possibility of damaging the element electrode 52 is reduced and the connection reliability between the covering 18 and the element electrode 52 is improved.

The semiconductor device 50 is press-bonded to the insulating resin layer 70 in a manner such that an electrode surface of the semiconductor device 50 provided with the element electrodes 52 is disposed toward an insulating resin layer 70 side. A protective layer 54 of the semiconductor device 50 is stacked on the semiconductor device 50 wherein the protective layer 50 has openings for the element electrodes 52. A specific example of the semiconductor device 50 is a semiconductor chip such as an integrated circuit (IC) or a large-scale integrated circuit (LSI). A specific example of the protective layer 54 is a polyimide layer. For example, aluminum is used as the element electrode 52.

(Manufacturing Method of Semiconductor Module)

FIGS. 2A to 2E are cross-sectional views showing a process in a method for forming the bump electrodes 16 and the coverings 18.

Figure 2A:
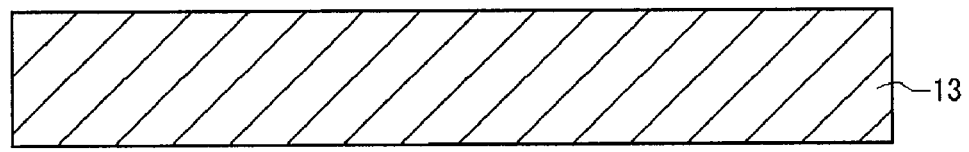
FIGS. 2A to 2E are cross-sectional views showing a process in a method for forming bump electrodes and coverings.

As shown in FIG. 2A, a copper sheet 13 having the thickness at least larger than the sum of the height of the bump electrode 16 and the thickness of the wiring layer 14 is prepared as a metal sheet.

Figure 2B:

Then, as shown in FIG. 2B, a resist (not shown) is selectively formed on an electrode forming area by a lithography method, and bump electrodes 16 of a predetermined pattern is formed on the copper sheet 13 using the resist as a mask. The bump electrodes 16 are provided in positions corresponding respectively to the positions of element electrodes 52 formed on the semiconductor device 50 (See FIG. 3A).

Figure 2C:

Next, as shown in FIG. 2C, a resist 78 is stacked on a main surface S1 side of the copper sheet 13 up to a predetermined height. The height of the stacked resist 78 corresponds to the height of a region coated with the covering 18 discussed later. More specifically, the height of the resist 78 corresponds to the height of an exposed region. Here, this exposed region is a region where the top surface of the bump electrode 16 and a top-surface-side region of the side surface thereof which is less than or equal to one half of the height of the bump electrode 16 measured from the top surface thereof to a surface of the copper sheet 13, where the bump electrode 16 is provided, are exposed.

Figure 2D:
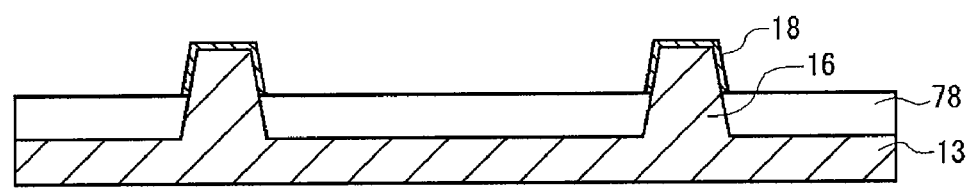

Next, as illustrated in FIG. 2D, the covering 18 is formed on an exposed region of the bump electrode 16. The covering 18 is formed by electrolytic plating or electroless plating as a Au/Ni metal layer, using the resist 78 as a mask, for instance.

As the covering 18 is formed by electrolytic plating or electroless plating as an Au/Ni metal layer, the direction of crystal grains of a metal that forms the covering 18 is aligned in a vertical direction to the contact surface of the element electrode 52. Accordingly, the pressure against the element electrode 52 at the time when the covering 18 is press-bonded to the element electrode 52 can be absorbed by the covering 18. As a result, the possibility of damaging the element electrodes 52 can be reduced. The covering 18 is formed by electrolytic plating or electroless plating. As a result, it can be formed at lower cost compared with a case where it is formed by a sputtering and the like. A metal layer that constitutes the covering 18 is formed so that a Ni layer lies on a side in contact with the bump electrode 16 and an Au layer lies on a side in contact with the element electrode 52. Note that the method for forming the covering 18 is not limited to the above-described one and, for example, it may be formed using conducive paste such as copper paste, silver paste and gold paste.

Figure 2E:
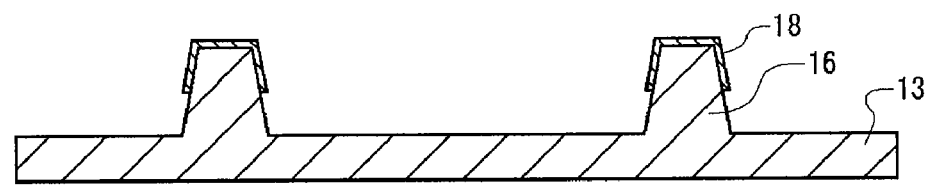

Then, as shown in FIG. 2E, the resist 78 is removed. The bump electrodes 16 and the coverings 18 are formed through the above-described processes.

In the first embodiment, the diameter of the bump electrode 16 at the bottom face of a wiring layer 14 side, and the diameter of the bump electrode 16 at the top surface and the height of the bump electrode 16 are 40 μmϕ, 30 μmϕ and 40 μmϕ, respectively. The thickness of the covering 18 is 5 μm; and of 5 μm, 1 μm is the thickness of the Au layer and 4 μm is the thickness of the Ni layer. The range of the covering 18 that covers a side surface of the bump electrode 16 is indicated by a region whose height measured from the top surface of the bump electrode 16 is less than or equal to 20 μm.

FIGS. 3A to 3D and FIGS. 4A and 4B are cross-sectional views showing a process in a method for connecting the bump electrodes 16 and the element electrodes 52.

Figure 3A:
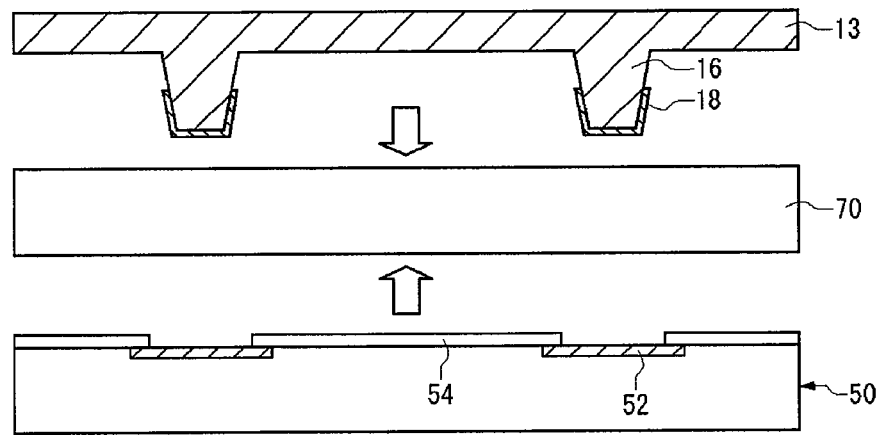
FIGS. 3A to 3D are cross-sectional views showing a process in a method for connecting bump electrodes and element electrodes.

As shown in FIG. 3A, an insulating resin layer 70 is held between a semiconductor device 50 where element electrodes 52 having predetermined patterns are formed and a copper sheet 13 formed using the above-described method. The film thickness of the insulating resin layer 70 is approximately equal to the height of the bump electrode 16 and is about 40 μm.

Figure 3B:
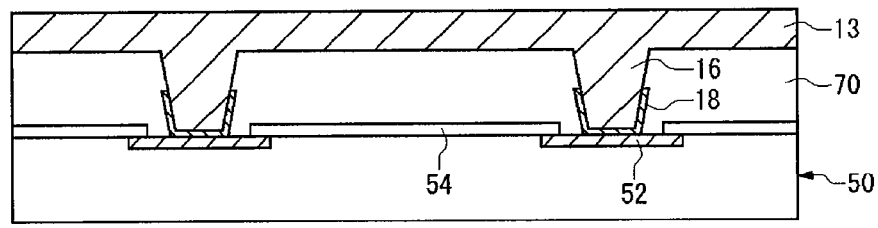

As shown in FIG. 3B, the semiconductor device 50, the insulating resin layer 70 and the copper sheet 13 are press-formed by a press machine into a single block. The pressure and the temperature for the press-forming are about 5 MPa and 180° C., respectively. The press-forming causes the bump electrodes 16 and the coverings 18 to penetrate the insulating resin layer 70. As a result, the coverings 18 are press-bonded to the element electrodes 52 and thus the bump electrodes 16 are electrically coupled with the element electrodes 52. The bump electrode 16 and the covering 18, whose overall shape is narrower toward the tip portion thereof, penetrates the insulating resin layer 70 smoothly.

Figure 3C:
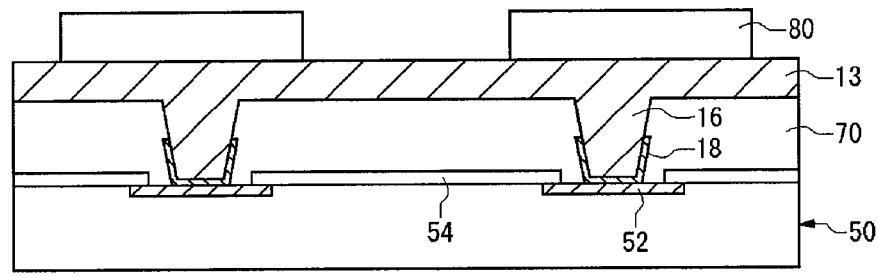

Next, as illustrated in FIG. 3C, resists 80 are selectively formed according to the patterns of wiring layer 14 by the lithography method. More specifically, a resist film of a predetermined thickness is affixed to the copper sheet 13 by a laminator unit, and it is then exposed using a photo mask having the patterns of wiring layer 14. After this, the resists in the unexposed areas are removed by a development using a $Na_2CO_3$ solution, which will selectively form the resists 80 on the copper sheet 13. To improve the adhesion of the resists 80 to the copper sheet 13, it is desirable that a pretreatment, such as grinding, cleaning and the like, be performed as appropriate on the surface of the copper sheet 13 before the lamination of the resist film thereon. Before the lamination of the resist film, the copper sheet 13 may be adjusted into the thickness of the wiring layer 14 by etching the whole of the opposite side of the copper sheet 13.

Figure 3D:
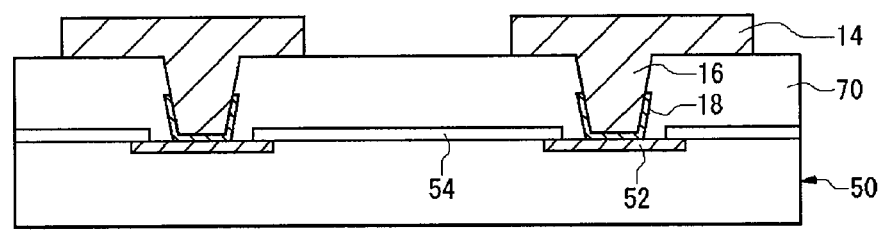

As shown in FIG. 3D, etching is done to an exposed part of the copper sheet 13, using a ferric chloride solution to form wiring layers 14 having predetermined wiring patterns. Then the resists 80 are removed using a stripping agent, such as an NaOH solution. In the first embodiment, the thickness of the wiring layer 14 is 15 μm.

Figure 4A:
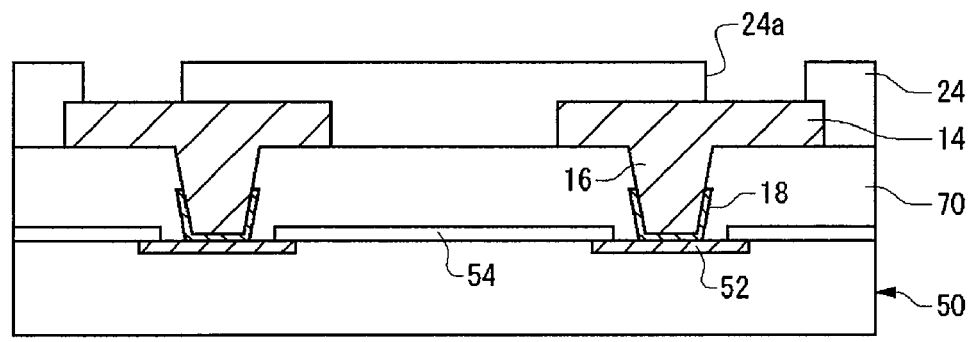
FIGS. 4A and 4B are cross-sectional views showing a process in a method for connecting bump electrodes and coverings.

Then, as shown in FIG. 4A, a wiring protective layer 24 having an opening 24a is stacked on the wiring layer 14 at the side opposite to the insulating resin layer 70.

Figure 4B:
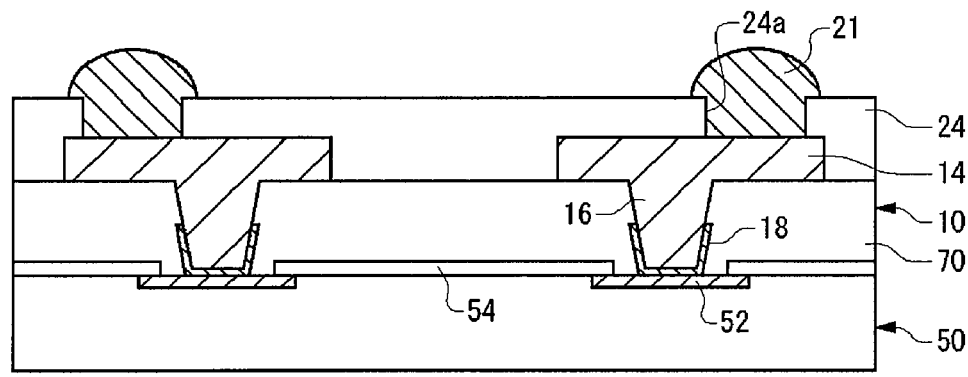

Then, as shown in FIG. 4B, a solder bump 21 is formed on the wiring layer 14 which is exposed in the opening 24a. The position in which the solder bump 21 is to be formed may be a targeted position where circuit wiring is extended through a rewiring.

By employing the above-described manufacturing process, a semiconductor module 30 is obtained. If the semiconductor device 50 is not stacked, the board 10 will be obtained.

A description is given hereunder of advantageous effects of the present embodiment obtained by providing the covering 18 on the bump electrode 16.

Figure 5:
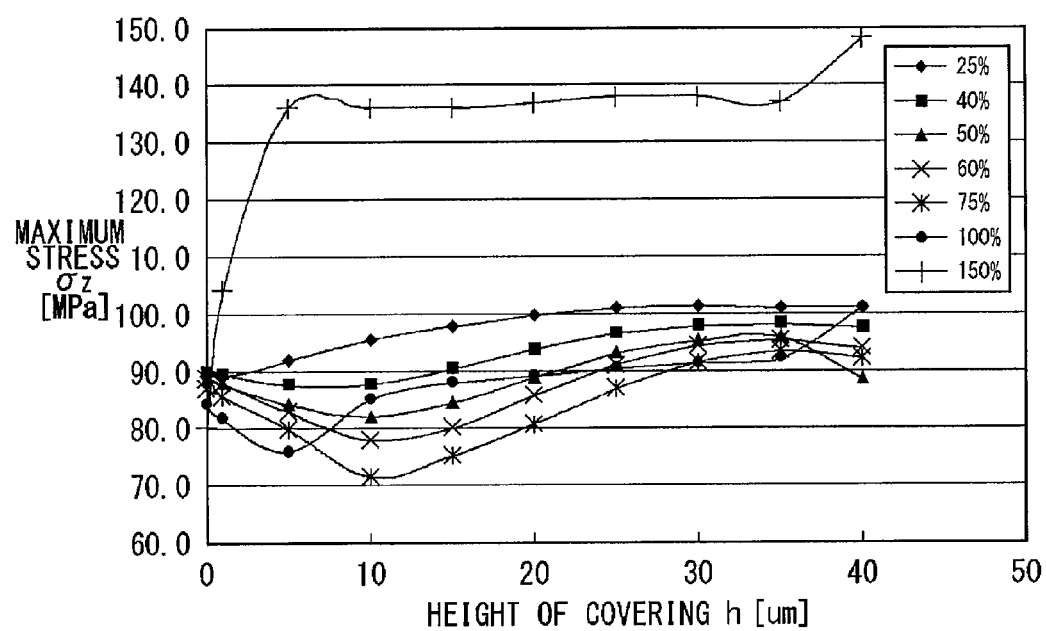
FIG. 5 is a graph showing a change in the maximum stress occurring at an interface between a covering and an element electrode due to temperature change.

FIG. 5 is a graph showing a calculated relation (by Finite Element Method) between a region of formation of the covering 18 (the height of the covering) and the maximum stress caused at the interface between the covering 18 and the element electrode 52, for each covering 18 formed of a metal material of different yield stress in an atmosphere where the temperature varies from 25° C. to 125° C. The copper is used as a material that forms the bump electrode 16, and the relation is investigated when the yield stress of the metal material that forms the covering 18 varies from 25% to 150% of the yield stress of the bump electrode 16.

The top surface of the bump electrode 16 and the region, at a side surface thereof, continuous with the top surface thereof excluding a region in contact with the wiring layer 14 are covered or coated, so that the stress caused at the interface between the covering 18 and the element electrode 52 disperses. Thus, as shown in FIG. 5, it is evident that the value of the maximum stress occurring in the element electrode 52 can be reduced. If the yield stress of the covering 18 is greater than 40% and less than or equal to 100% of the yield stress of the bump electrode, there exists a local minimal value of the maximum stress. Thus, it is found that it is possible to effectively control the stress acting on the interface between the covering 18 and the bump electrode 16 if the yield stress is greater than 40% and less than or equal to 100%. If the height h of the covering is 0 μm or 40 μm which is the same as the height of the bump electrode 16, in theory this is the same situation as when no covering is provided. In the light of this, the values of the maximum yield stress for the covering 18 having different heights (greater than 0 μm and less than 40 μm) are compared against those for the covering 18 having 0 μm and 40 μm as their references. As a result, it is found that when the yield stress is greater than or equal to 50% and less than or equal to 75% and the height of the covering is less than or equal to ½ of the height of the bump electrode 16, the maximum stress occurring in the interface between the covering 18 and the bump electrode 16 can be made smaller.

FIGS. 6A and 6B are schematic diagrams showing calculated distributions (by Finite Element Method) of the stress caused in an atmosphere where the temperature varies from 25° C. to 125° C., in the bump electrodes 16 where the covering 18 having the yield stress of 50% and the covering height h of 10 μm (which is ¼ of the height of the bump electrode 16) and the covering having the yield stress of 50% and the covering height h of 40 μm (which is the same height as that of the bump electrode 16), respectively.

As shown in FIG. 6B, when the covering height h is the same as the height of the bump electrode 16, the stress is concentrated at the interface between the covering 18 and the element electrode 52. As shown in FIG. 6A, on the other hand, when the covering height h of the covering 18 is ¼ of the height of the bump electrode 16, the stress is concentrated on the interior of the bump electrode 16. In other words, the provision of the covering 18 enables the area, where the stress caused by the temperature change is concentrated, to migrate from the interface between the covering 18 and the element electrode 52 to the interior of the bump electrode 16. This can disperse the stress acting on the interface between the covering 18 and the element electrode 52, so that the maximum stress occurring in the interface thereof can be reduced.

As described above, by employing this first embodiment, the coverings 18 are provided on the bump electrodes 16, so that the position where the stress caused by the temperature change is concentrated can be moved from the interface between the covering 18 and the element electrode 52 to a bump electrode 16 side. As a result, the maximum stress occurring in the interface can be made smaller. Thus, when the semiconductor device 50 is mounted on the packaging board 10, the possibility of damaging the element electrodes 52 is reduced and the connection reliability between the bump electrode 16 and the element electrode 52 is improved. Furthermore, the connection reliability between the board 10 and the semiconductor device 50 is improved. Also, the provision of the coverings prevents the semiconductor device 50 from getting broken, so that the yield of the semiconductor modules 30 can be enhanced and the manufacturing cost of semiconductor modules 30 can be reduced.

Second Embodiment

In the above-described first embodiment, the insulating resin layer 70 is held and press-formed between the copper sheet 13 and the semiconductor device 50 and thereby the semiconductor device 50, the insulating resin layer 70 and the copper sheet 13 are united into one body so as to form the semiconductor module 30. The semiconductor module 30 may also be formed as follows. Note that the other components in the semiconductor module 30, the method for manufacturing the bump electrodes 16 and the coverings 18, and the like are basically the same as those in the first embodiment and therefore the description thereof is omitted as appropriate.

FIGS. 7A to 7D are cross-sectional views showing a process in a method for manufacturing the semiconductor module 30 according to the second embodiment.

Figure 7A:
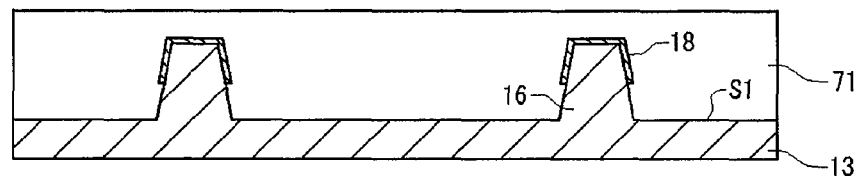
FIGS. 7A to 7D are cross-sectional views showing a process in a method for manufacturing a semiconductor module according to a second embodiment of the present invention.

As shown in FIG. 7A, the above-described epoxy thermosetting resin 71 is stacked on the main surface S1 of one face of the copper sheet 13.

Figure 7B:
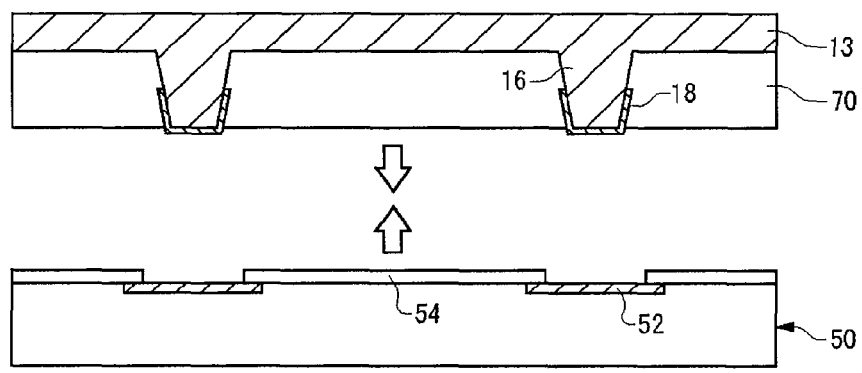
Figure 7C:
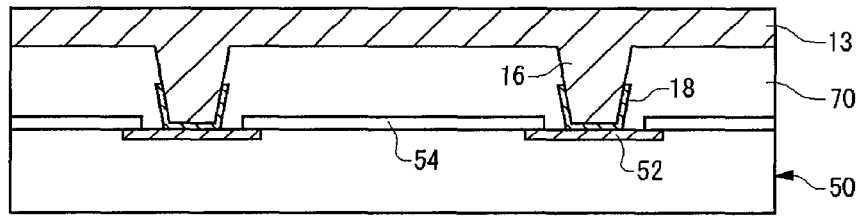

Then, as shown in FIG. 7B, a covering 18 is exposed by etching the epoxy thermosetting resin 71 so as to form an insulating resin layer 70. Then the copper sheet 13, on which the insulating resin layer 70 has been formed, and the semiconductor device 50 are press-formed so as to unite the semiconductor device 50, the insulating resin layer 70 and the copper sheet 13 into a single block as shown in FIG. 7C.

Figure 7D:
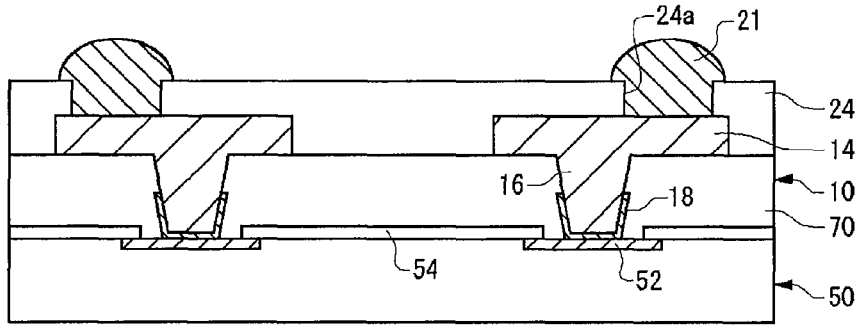

Then, as shown in FIG. 7D, by following the similar procedure as in the first embodiment, a wiring layer 14 is formed by etching the copper sheet 13; a wiring protective layer 24 having an opening 24a is laminated on a surface of the wiring layer 14 opposite to the insulating resin layer 70. Then, a solder bump 21 is formed on the wiring layer 14 which is exposed in the opening 24a.

By employing the above-described manufacturing process, a semiconductor module 30 is obtained. If the semiconductor device 50 is not stacked, the board 10 will be obtained.

According to the second embodiment, the following advantageous effects are achieved in addition to those of the first embodiment. That is, in the second embodiment the covering 18 is exposed from the insulating resin layer 70, so that the board 10 and the semiconductor device 50 can be accurately positioned when they are to be press-formed. At the same time, the connection reliability between the covering 18 and the element electrode 52 is improved. As a result, the connection reliability between the packaging board 10 and the semiconductor device 50 is further enhanced.

Third Embodiment

Though the semiconductor module 30 is formed using a so-called pasting process in the above-described first embodiment, the semiconductor module 30 may be formed using a so-called buildup process as will be shown in the following third embodiment. Note that description of the other components similar to those of the first embodiment is omitted as appropriate.

FIGS. 8A to 8F and FIGS. 9A to 9C are cross-sectional views showing a process in a method for manufacturing a semiconductor module 30 according to the third embodiment.

Figure 8A:
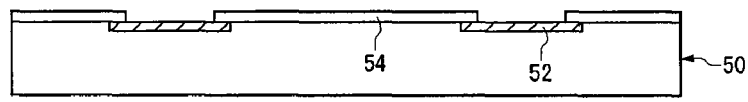
FIGS. 8A to 8F are cross-sectional views showing a process in a method for manufacturing a semiconductor module according to a third embodiment of the present invention.

As shown in FIG. 8A, a semiconductor device 50 in which an element electrode 52 of a predetermined pattern is formed is prepared.

Figure 8B:
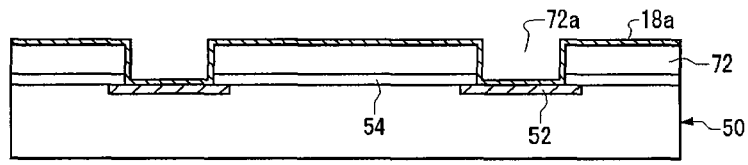

Then, as shown in FIG. 8B, a resin layer 72 is stacked on a protective layer 54 of a semiconductor device 50. The resin layer 72 may be formed as follows. That is, the above-described epoxy thermosetting resin is laminated on the entire surface of the element electrode 52 side of the semiconductor device 50; the resin on the upper region of the element electrode 52 is etched; and thereby an opening 72a is provided. In this manner, the resin layer 72 is formed. The thickness (height) of the resin layer 72 corresponds to the height of a region coated with the covering 18. Then, a metallic coated film 18a is formed on the side of the semiconductor device 50, where the resin layer 72 has been stacked, by the sputtering or the like.

Figure 8C:
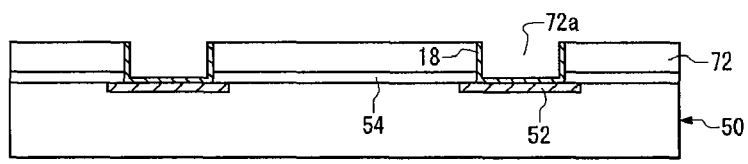

Then, as shown in FIG. 8C, a region of the coated film excluding the inner surface of the opening 72a is removed from the coated film 18a. As a result, the covering 18 is formed.

Figure 8D:
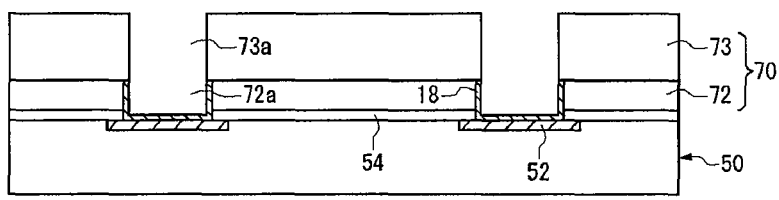

Then, as shown in FIG. 8D, the resin layer 73 made of the above-described epoxy thermosetting resin is stacked on the resin layer 72. In the resin layer 73, an opening 73a is provided above the opening 72a. The insulating resin layer 70 is formed as one block by the resin layer 72 and the resin layer 73. The resin layer 73 can be provided as follows, for instance. That is, a mask is provided in the opening 72a; the resin layer 73 is stacked; and then the mask is removed. Alternatively, the resin layer 73 may be provided as follows. That is, the epoxy thermosetting resin is laminated on the whole surface of one side of the semiconductor device 50 where the resin layer 72 has been stacked; a region excluding a part thereof in which the opening 72a is provided (an upper area of the element electrode 52) may be masked; and the openings 72a and 73a are formed.

Figure 8E:
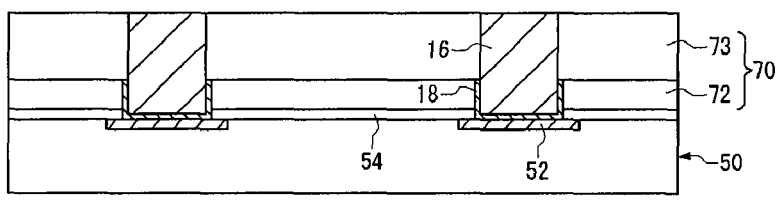

Then, as shown in FIG. 8E, a bump electrode 16 is formed within the openings 72a and 73a. The bump electrode 16 can be formed by electrolytic plating or electroless plating, for instance. Or the bump electrode 16 can be formed using the copper paste.

Figure 8F:
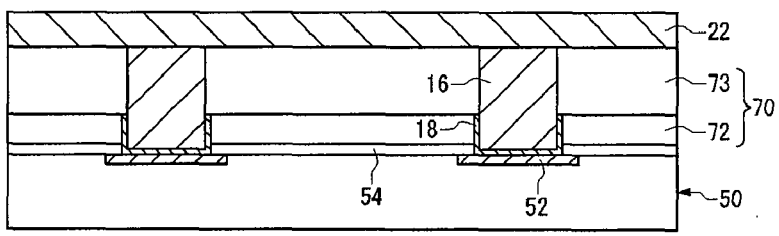

Then, as shown in FIG. 8F, the copper sheet 22 is laminated on the whole surface of a resin layer 73 side of the semiconductor device 50.

Figure 9A:
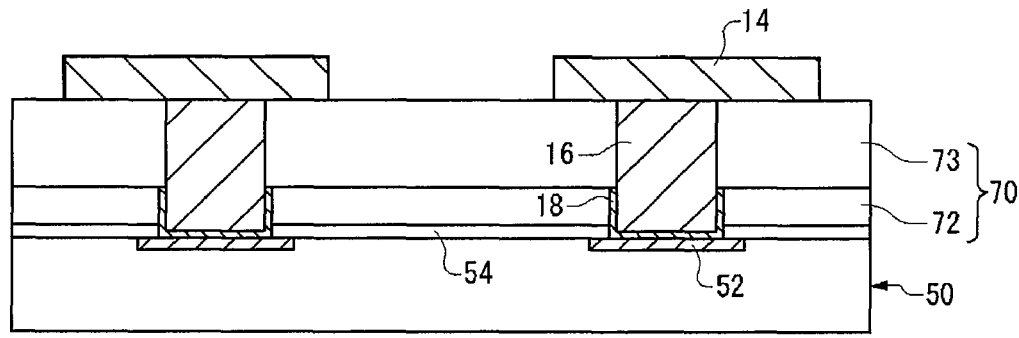
FIGS. 9A to 9C are cross-sectional views showing a process in a method for manufacturing a semiconductor module according to the third embodiment of the present invention.

Then, as shown in FIG. 9A, a resist (not shown) is selectively formed on a wiring layer forming area of the copper sheet 22 by the lithography method, and a wiring layer 14 of a predetermined pattern is formed using the resist as a mask.

Figure 9B:
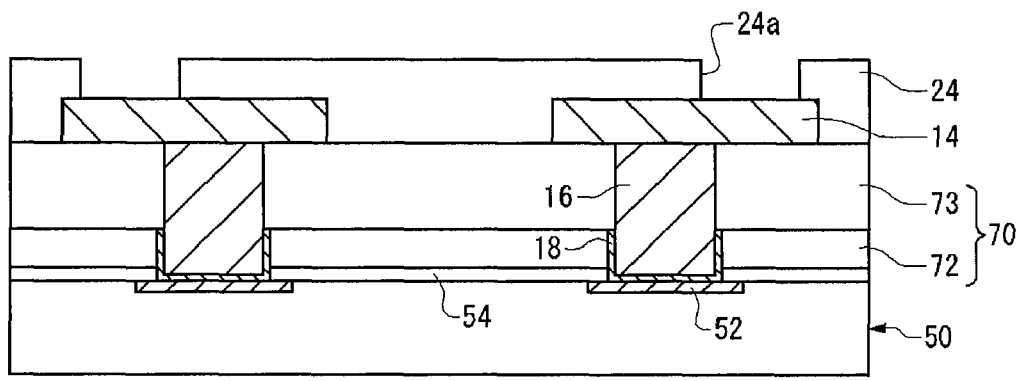

Then, as shown in FIG. 9B, the wiring protective layer 24 having the opening 24a is laminated on the surface of the wiring layer 14 opposite to the insulating resin layer 70.

Figure 9C:
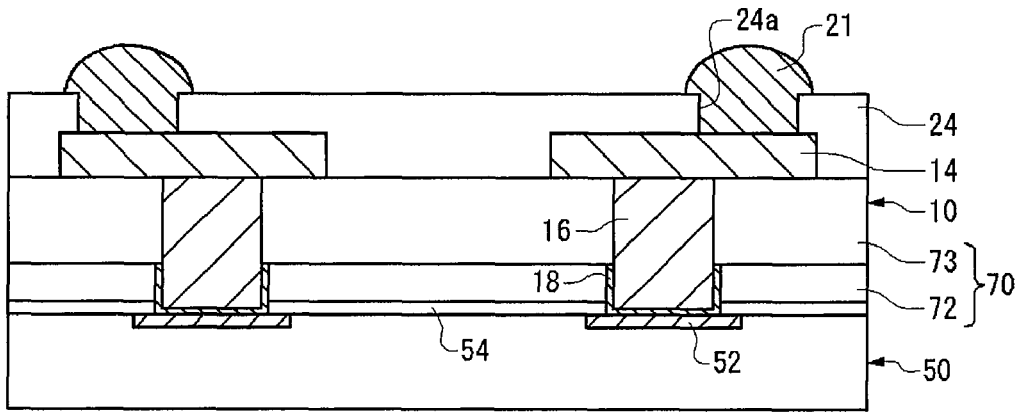

Then, as shown in FIG. 9C, the solder bump 21 is formed on the wiring layer 14 which is exposed in the opening 24a.

By employing the above-described manufacturing process, a semiconductor device 30 is obtained. If the semiconductor device 50 is not used, the board 10 will be obtained.

According to the third embodiment, the following advantageous effects are achieved in addition to those of the first embodiment. That is, when the semiconductor module 30 is to be formed using a buildup process as in the third embodiment, the board 10 and the semiconductor device 50 are not press-bonded together as in the pasting process. Hence, the possibility of damaging the semiconductor devices 50 at the time of the manufacturing of semiconductor modules 30 can be reduced. Since the rates of thermal expansion greatly differ among the copper used in the wiring layer 14, the resin used in the insulating resin layer 70 and the silicon used in the semiconductor device 50, warping may occur in each member in the pasting process as a result of the thermal treatment in the press-forming. On the other hand, the thermal treatment as performed in the pasting process is not performed in the buildup process employed in the third embodiment. Thus the occurrence of such warping can be suppressed, so that the connection reliability between the board 10 and the semiconductor device 50 can be further enhanced.

Fourth Embodiment

In a fourth embodiment of the present invention, a semiconductor module 30 is formed by employing a combined process of the pasting process and the buildup process. Note that the other components in the semiconductor module 30, the method for manufacturing the bump electrodes 16, and the like are basically the same as those employed in the first embodiment and therefore the description thereof is omitted as appropriate.

FIGS. 10A to 10D and FIGS. 11A and 11B are cross-sectional views showing a process in a method for manufacturing the semiconductor module 30 according to the fourth embodiment.

Figure 10A:
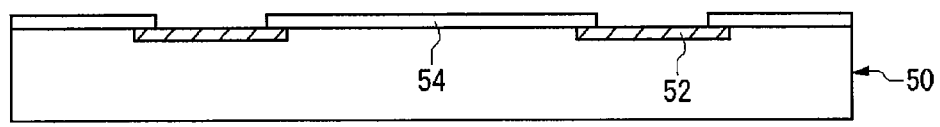
FIGS. 10A to 10D are cross-sectional views showing a process in a method for manufacturing a semiconductor module according to a fourth embodiment of the present invention.

As shown in FIG. 10A, a semiconductor device 50 in which an element electrode 52 of a predetermined pattern is formed is prepared.

Figure 10B:
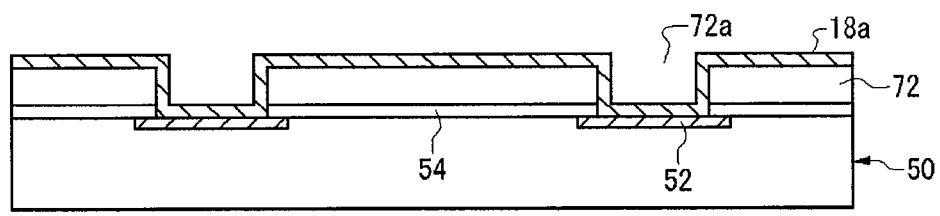

Then, as shown in FIG. 10B, a resin layer 72 is stacked on a protective layer 54 of a semiconductor device 50. The resin layer 72 may be formed as follows. That is, the above-described epoxy thermosetting resin is laminated on the entire surface of the element electrode 52 side of the semiconductor device 50; the resin on the upper region of the element electrode 52 is etched; and thereby an opening 72a is provided. In this manner, the resin layer 72 is formed. The film thickness (height) of the resin layer 72 corresponds to the height of a region coated with the covering 18. Then, a metallic coated film 18a is formed on the side of the semiconductor device 50, where the resin layer 72 has been stacked, by the sputtering or the like.

Figure 10C:
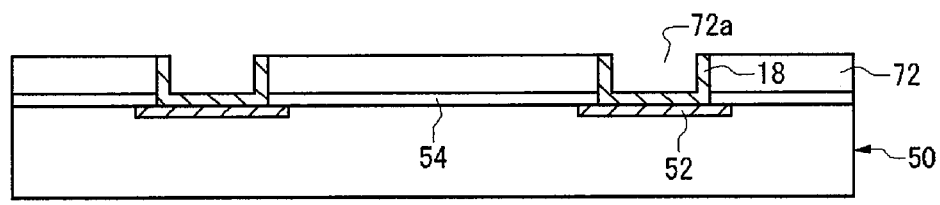

Then, as shown in FIG. 10C, a region of the coated film excluding the inner surface of the opening 72a is removed from the coated film 18a. As a result, the covering 18 is formed.

Figure 10D:
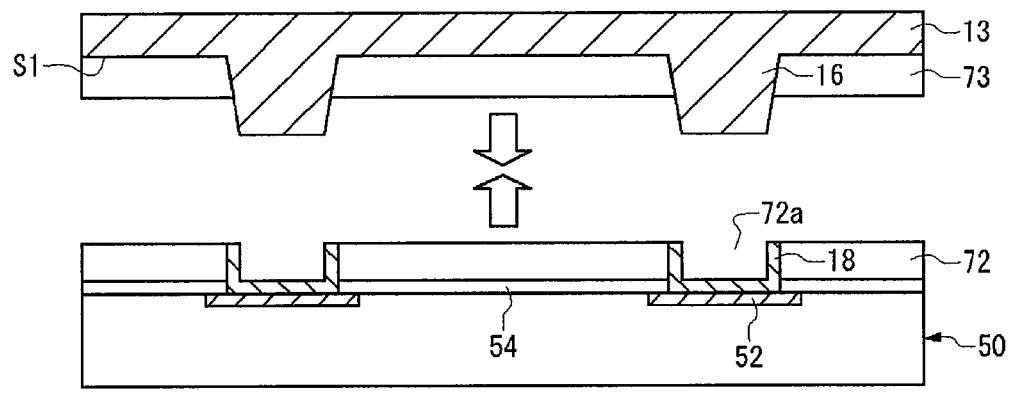
Figure 11A:
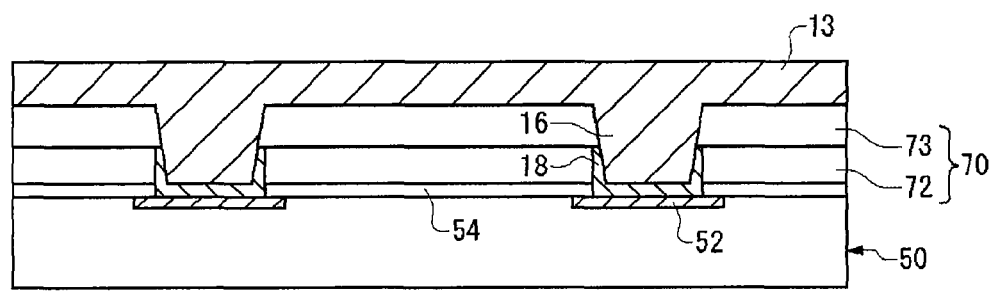
FIGS. 11A and 11B are cross-sectional views showing a process in a method for manufacturing a semiconductor module according to the fourth embodiment of the present invention.

Then, as shown in FIG. 10D, a resin layer 73 is stacked on a main surface S1 side of the copper sheet 13 up to a predetermined height. Then, the semiconductor device 50 where the covering 18 has been formed, and the copper sheet 13 on which the resin layer 73 been stacked are press-formed into a single block as shown in FIG. 11A.

Figure 11B:
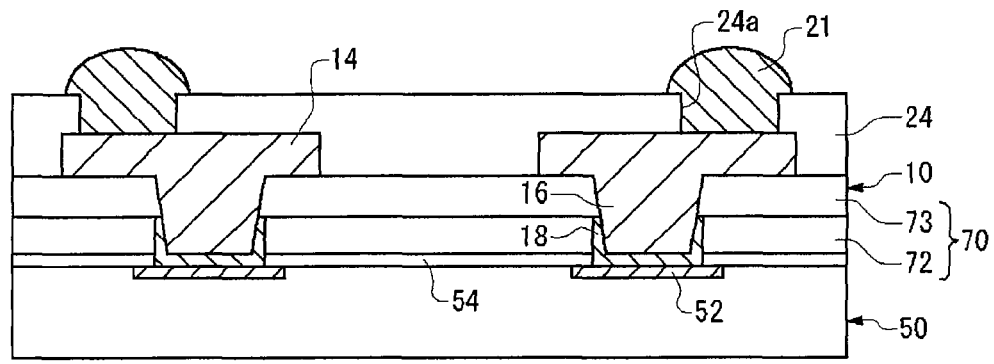

Then, as shown in FIG. 11B, by following the similar procedure as in the first embodiment, a wiring layer 14 is formed by etching the copper sheet 13; a wiring protective layer 24 having an opening 24a is laminated on a surface of the insulating resin layer 70 opposite to the wiring layer 14. Then, a solder bump 21 is formed on the wiring layer 14 which is exposed in the opening 24a.

By employing the above-described fabrication process, a semiconductor module 30 is obtained. If the semiconductor device 50 is not used, the board 10 will be obtained.

According to the fourth embodiment, the following advantageous effects are achieved in addition to those of the first embodiment. That is, the covering 18 is formed on the element electrode 52 using the buildup process and then the packaging board 10 and the semiconductor device 50 are press-bonded. As a result, the stress acting on the interface between the covering 18 and the element electrode 52 can be dispersed by the press-bonding as compared with a case where the insulating resin layer 70 is held and press-bonded between the board 10 and the semiconductor device 50. This reduces the possibility of damaging the element electrodes 52 at the time of the manufacturing of semiconductor modules 30, so that the connection reliability between the bump electrode 16 and the element electrode 52 is further enhanced.

Fifth Embodiment

In a fifth embodiment of the present invention, a semiconductor module 30 is formed by employing a combined process of the pasting process and the buildup process. A method for forming the covering 18 differs from the method employed in the above-described fourth embodiment. Note that the other components in the semiconductor module 30, the method for manufacturing the bump electrodes 16, and the like are basically the same as those employed in the first embodiment and therefore the description thereof is omitted as appropriate.

FIGS. 12A to 12D and FIG. 13A are cross-sectional views showing a process in a method for manufacturing a semiconductor module 30 according to the fifth embodiment.

Figure 12A:
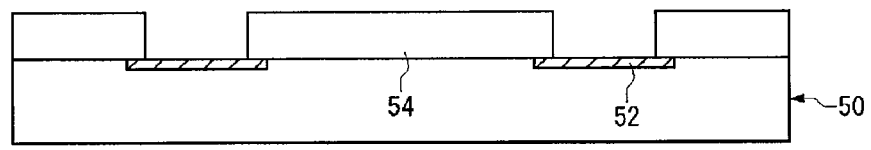
FIGS. 12A to 12D are cross-sectional views showing a process in a method for manufacturing a semiconductor module according to a fifth embodiment of the present invention.

As shown in FIG. 12A, a semiconductor device 50 in which an element electrode 52 of a predetermined pattern is formed is prepared. In this fifth embodiment, the thickness (height) of a protective layer 54 provided on the semiconductor device 50 corresponds to the height of a region coated with the covering 18.

Figure 12B:
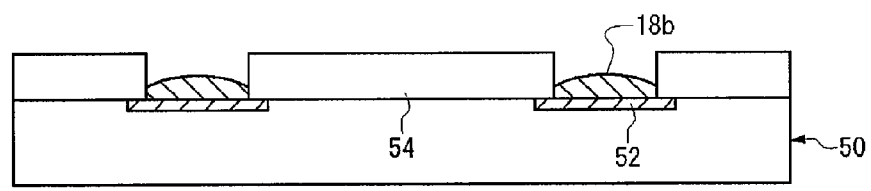

Then, as shown in FIG. 12B, conducive paste 18b such as copper paste, silver paste and gold paste is applied to within an opening formed in the protective layer 54.

Figure 12C:
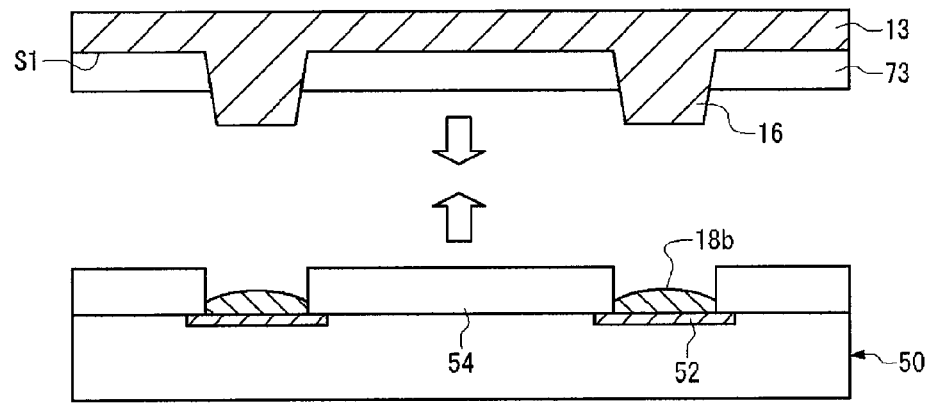
Figure 12D:
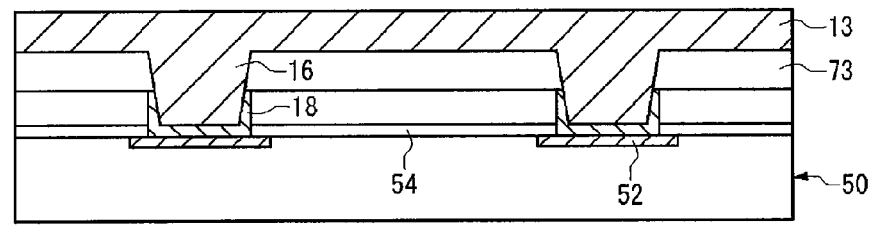

Then, as shown in FIG. 12C, a resin layer 73 made of the above-described epoxy thermosetting resin is stacked on a main surface S1 side of the copper sheet 13 up to a predetermined height wherein bump electrodes 16 are formed on the copper sheet 13. Then, the semiconductor device 50 where the covering has been formed, and the copper sheet 13 on which the resin layer 73 been stacked are press-formed into a single block as shown in FIG. 12D. At the time of the press-forming, the bump electrode 16 enters within the opening of the protective layer 54 and the tip of the bump electrode 16 is absorbed into the conductive paste 18b. Thereby the conductive past 18b is plastic-deformed and elongated between the interior of an opening and the bump electrode 16, so that the covering 18 is formed.

Figure 13A:
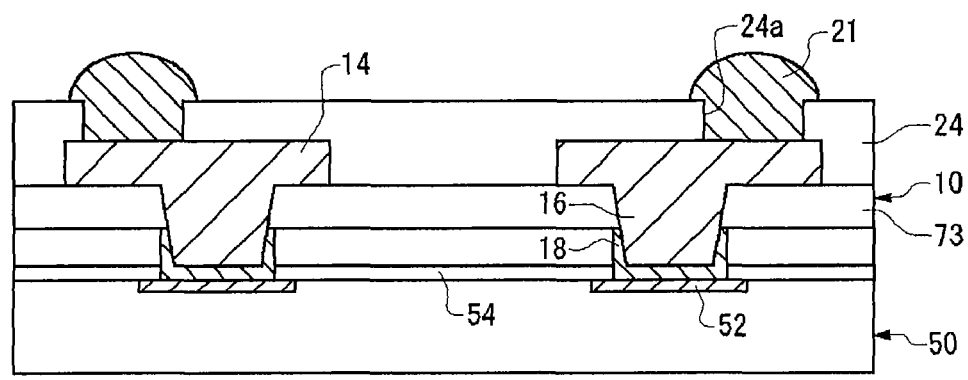
FIG. 13A is a cross-sectional view showing a process in a method for manufacturing a semiconductor module according to the fifth embodiment of the present invention.

Then, as shown in FIG. 13A, a wiring layer 14 is formed by etching the copper sheet 13 the same way as in the first embodiment; a wiring protective layer 24 having openings 24a is laminated on a surface of the wiring layer 14 opposite to the insulating resin layer 70. Then, a solder bump 21 is formed on the wiring layer 14 which is exposed in the openings 24a.

By employing the above-described manufacturing process, a semiconductor device 30 is obtained. If the semiconductor device 50 is not used, the board 10 will be obtained.

According to the fifth embodiment, the following advantageous effects are achieved in addition to those of the first embodiment. That is, since the coverings 18 are formed in such a manner that the conductive paste is plastic-formed by press-bonding the bump electrode 16 and the conductive paste, the covering 18 can be formed easily. Also, since the conductive paste can absorb the stress caused by the press-bonding, the possibility of damaging the element electrodes 52 at the time of manufacturing the semiconductor module 30 is reduced and therefore the connection reliability between the bump electrode 16 and the element electrode 52 is enhanced.

Sixth Embodiment

A semiconductor module 30 according to a sixth embodiment differs from the first or the second embodiment in that the semiconductor module 30 includes an insulating resin layer 12, a wiring layer 15, which is a second wiring layer (wherein a wiring layer 14 serves as a first wiring layer), a bump electrode 20 provided on a surface of the wiring layer 15 at an insulating resin layer 12 side. Note that the other components in the semiconductor module 30, the method for manufacturing the bump electrodes 16 and the coverings 18, and the like are basically the same as those employed in the first or the second embodiment and therefore the description thereof is omitted as appropriate.

Figure 14:
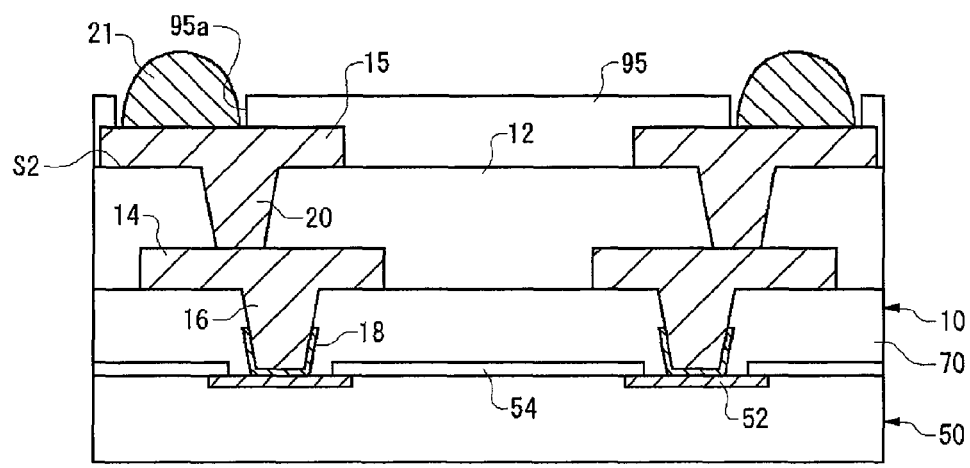
FIG. 14 is a schematic cross-sectional view showing a structure of a board and a semiconductor module according to a sixth embodiment of the present invention.

FIG. 14 is a schematic cross-sectional view showing a structure of a board 10 and a semiconductor module 30 using the board 10, according to the sixth embodiment.

The semiconductor module 30 according to the sixth embodiment further includes an insulating resin layer 12 provided on a surface of the wiring layer 14, which is the first wiring layer, opposite to the insulating layer 70, a wiring layer 15, which is the second wiring layer, formed on a surface of the insulating resin layer 12 opposite to the wiring layer 14, and a bump electrode 20 provided on a surface of the wiring layer 15 at an insulating resin layer 12 side.

The material used to form the insulating resin 12 is, for instance, a melamine derivative, such as BT resin, or a thermosetting resin, such as liquid-crystal polymer, epoxy resin, PPE resin, polyimide resin, fluorine resin, phenol resin or polyamide bismaleimide. From the viewpoint of improving the heat radiation of the semiconductor module 30, it is desirable that the insulating resin has a high thermal conductivity. In this respect, it is preferable that the insulating resin layer 12 contains, as a high thermal conductive filler, silver, bismuth, copper, aluminum, magnesium, tin, zinc, or an alloy thereof.

The wiring layer 15 is formed by conductive material, preferably a rolled metal or more preferably a rolled copper. The wiring layer 14 and the wiring layer 15 are electrically connected to each other by way of the bump electrode 20 provided on the wiring layer 15. A solder bump 21 is formed in a predetermined position of the wiring layer 15. The position in which the solder bump 21 is formed is, for instance, a targeted position where circuit wiring is extended through a rewiring. A wiring protective layer 95 is provided on the surface of the wiring layer 15 opposite to the insulating resin layer 12. In an opening 95a formed in the wiring protective layer 95, the solder bump 21 is connected to the wiring layer 15.

(Manufacturing Method of Semiconductor Module)

Figure 15A:
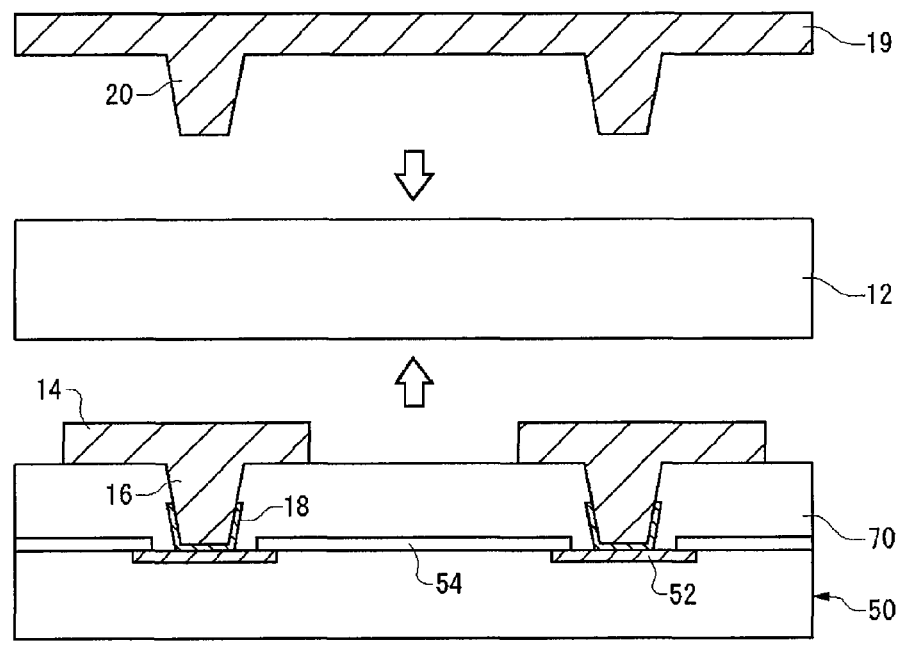
FIGS. 15A and 15B are cross-sectional views showing a process in a method for manufacturing a semiconductor module.
Figure 15B:
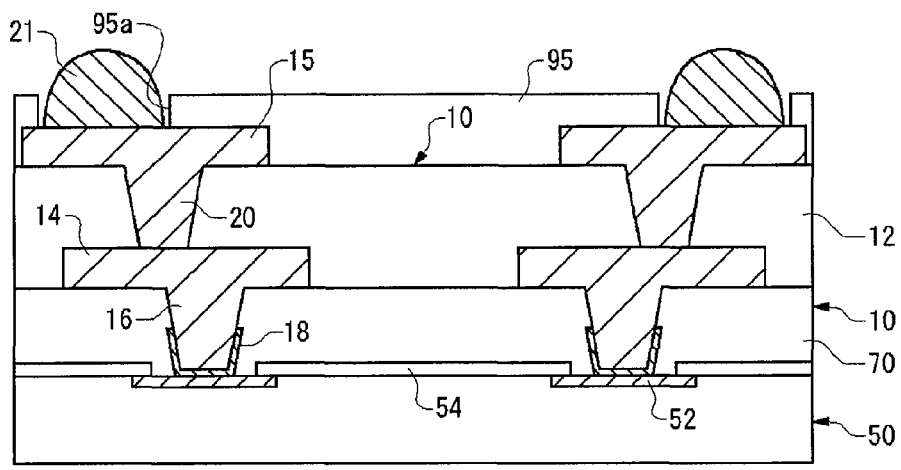

FIGS. 15A and 15B are cross-sectional views showing a process in a method for forming the semiconductor module 30.

Subsequent to the processes shown in FIGS. 2A to 2E and FIGS. 3A to 3D, a copper sheet 19 where a bump electrode 20 is formed is prepared similarly to the process shown in FIGS. 2A and 2B. Then, as shown in FIG. 15A, an insulating resin layer 12 is held between the semiconductor device 50, where the insulating resin layer 70 and the wiring layer 14 are press-bonded together, and the copper sheet 19. Then, similarly to the process shown in FIGS. 3A and 3B, the wiring layer 14, the insulating resin layer 12 and the copper sheet 19 are heated and press-bonded by the press-forming.

Then, as shown in FIG. 15B, similarly to the wiring layer 14, predetermined patterns of wiring layer 15 are formed on a wiring-layer forming area of the copper sheet 19. After the removal of the resist used in the formation of the wiring layers 15, the wiring protective layer 95 having the openings 95a is stacked similarly to the process shown in FIGS. 4A and 4B and the solder bumps 21 are formed on the wiring layer 15 which is exposed in the openings 95a.

By employing the above-described manufacturing process, a semiconductor module 30 is obtained. Note that if the manufacturing method according to the sixth embodiment is applied to that according to the second embodiment, the same semiconductor module 30 can be obtained. Such a multilayered structure as this can also achieve the same advantageous effects as those in the first or the second embodiment.

Seventh Embodiment

A semiconductor module 30 according to a seventh embodiment differs from the third embodiment in that the semiconductor module 30 includes an insulating resin layer 12, a wiring layer 15, which is a second wiring layer (wherein a wiring layer 14 serves as a first wiring layer), and a bump electrode 20 provided on a surface of the wiring layer 15 at an insulating resin layer 12 side. Note that the other components in the semiconductor module 30, the method for manufacturing the bump electrodes 16 and the coverings 18, and the like are basically the same as those employed in the first or the third embodiment. Note also that the structures of and the method for forming the insulating resin layer 12, the wiring layer 15 and the bump electrodes 20 are also the same as those in the sixth embodiment and therefore the description thereof is omitted as appropriate.

Figure 16:
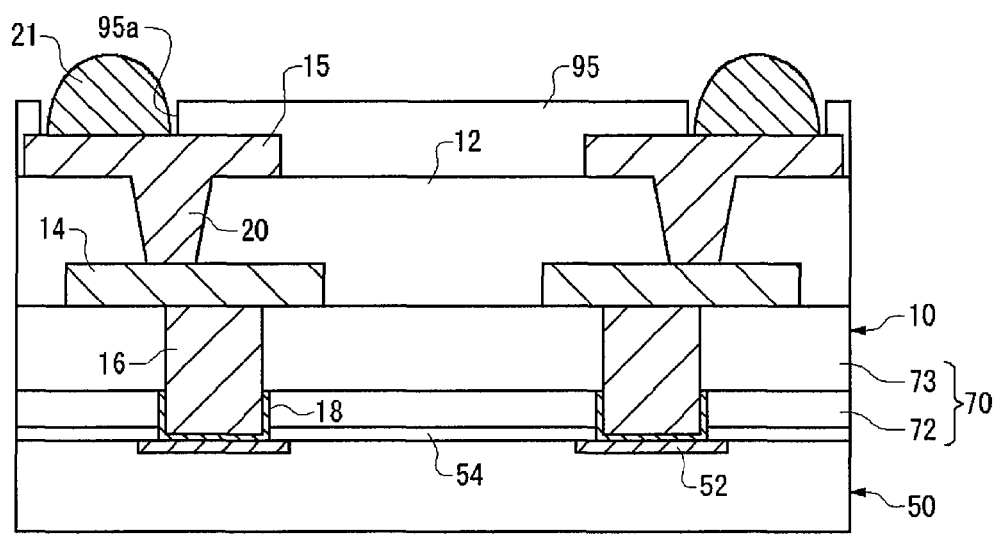
FIG. 16 is a schematic cross-sectional view showing a structure of a board and a semiconductor module according to a seventh embodiment of the present invention.

FIG. 16 is a schematic cross-sectional view showing a structure of a board 10 and a semiconductor module 30 using the board 10, according to the seventh embodiment.

The semiconductor module 30 according to the seventh embodiment further includes an insulating resin layer 12 provided on a surface of the wiring layer 14, which is the first wiring layer, opposite to the insulating layer 70, a wiring layer 15, which is the second wiring layer, formed on a surface of the insulating resin layer 12 opposite to the wiring layer 14, and a bump electrode 20 provided on a surface of the wiring layer 15 at an insulating resin layer 12 side. The wiring layer 14 and the wiring layer 15 are electrically connected to each other by way of the bump electrodes 20. A wiring protective layer 95 having openings 95a is laminated on the surface of the wiring layer 15. Such a multilayered structure as this can also achieve the same advantageous effects as those in the third embodiment.

Eighth Embodiment

A semiconductor module 30 according to an eighth embodiment differs from the fourth embodiment in that the semiconductor module 30 includes an insulating resin layer 12 and a wiring layer 15, which is a second wiring layer (wherein a wiring layer 14 serves as a first wiring layer) and a bump electrode 20 provided on a surface of the wiring layer 15 at an insulating resin layer 12 side. Note that the other components in the semiconductor module 30, the method for manufacturing the bump electrodes 16 and the coverings 18, and the like are basically the same as those employed in the first or the fourth embodiment. Note also that the structures of and the method for forming the insulating resin layer 12, the wiring layer 15 and the bump electrodes 20 are the same as those in the sixth embodiment and therefore, the description thereof is omitted as appropriate.

Figure 17:
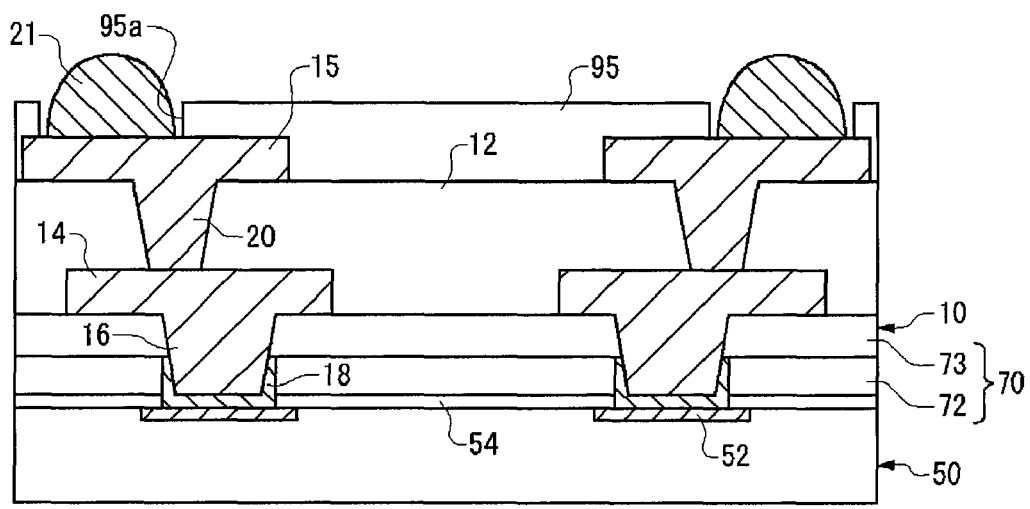
FIG. 17 is a schematic cross-sectional view showing a structure of a board and a semiconductor module according to an eighth embodiment of the present invention.

FIG. 17 is a schematic cross-sectional view showing a structure of a board 10 and a semiconductor module 30 using the board 10, according to the eighth embodiment.

The semiconductor module 30 according to the eighth embodiment further includes an insulating resin layer 12 provided on a surface of the wiring layer 14, which is the first wiring layer, opposite to the insulating layer 70, a wiring layer 15, which is the second wiring layer, formed on a surface of the insulating resin layer 12 opposite to the wiring layer 14, and a bump electrode 20 provided on a surface of the wiring layer 15 at an insulating resin layer 12 side. A wiring protective layer 95 having openings 95a is laminated on the surface of the wiring layer 15. Such a multilayered structure as this can also achieve the same advantageous effects as those in the fourth embodiment.

Ninth Embodiment

A semiconductor module 30 according to a ninth embodiment differs from the fifth embodiment in that the semiconductor module 30 includes an insulating resin layer 12 and a wiring layer 15, which is a second wiring layer (wherein a wiring layer 14 serves as a first wiring layer) and a bump electrode 20 provided on a surface of the wiring layer 15 at an insulating resin layer 12 side. Note that the other components in the semiconductor module 30, the method for manufacturing the bump electrodes 16 and the coverings 18, and the like are basically the same as that employed in the first or the fifth embodiment. Note also that the structures of and the method for forming the insulating resin layer 12 and the wiring layer 15 are the same as those in the sixth embodiment and therefore, the description thereof is omitted as appropriate.

Figure 18:
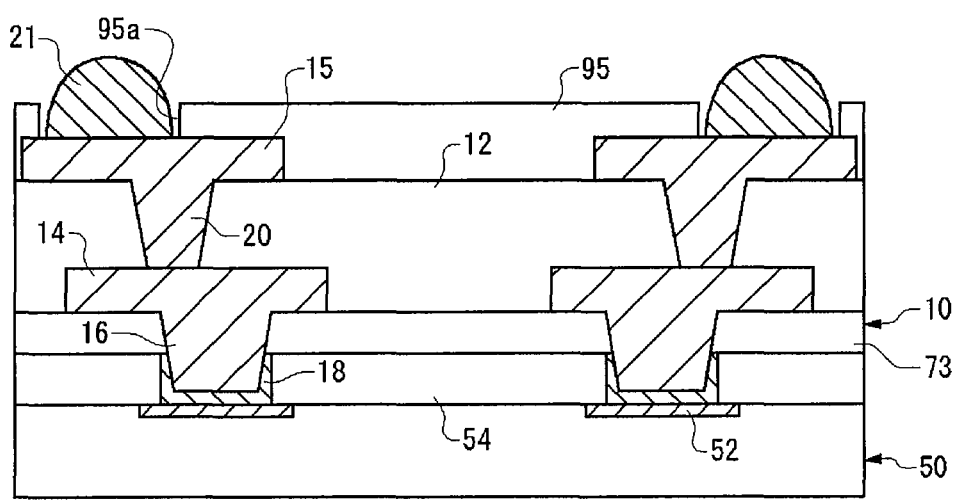
FIG. 18 is a schematic cross-sectional view showing a structure of a board and a semiconductor module according to a ninth embodiment of the present invention.

FIG. 18 is a schematic cross-sectional view showing a structure of a board 10 and a semiconductor module 30 using the board 10, according to the ninth embodiment.

The semiconductor module 30 according to the ninth embodiment further includes an insulating resin layer 12 provided on a surface of the wiring layer 14, which is the first wiring layer, opposite to the insulating resin layer 73, a wiring layer 15, which is the second wiring layer, formed on a surface of the insulating resin layer 12 opposite to the wiring layer 14, and a bump electrode 20 provided on a surface of the wiring layer 15 at an insulating resin layer 12 side. A wiring protective layer 95 having openings 95a is laminated on the surface of the wiring layer 15. Such a multilayered structure as this can also achieve the same advantageous effects as those in the fifth embodiment.

Tenth Embodiment

A tenth embodiment differs from the first embodiment in that the packaging board further includes another covering that covers or coats the base A. A description is given hereunder of the tenth embodiment. Note that the other structural components of the board, the structure of the semiconductor module and the method for manufacturing the semiconductor module excluding the board are basically the same as those of the first embodiment. The same components as those of the first embodiment are given the same reference numerals and the explanation thereof is omitted as appropriate.

Figure 19:
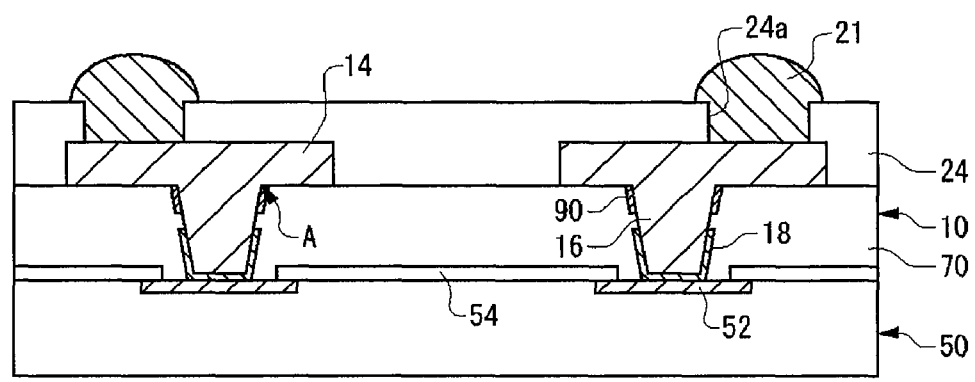
FIG. 19 is a schematic cross-sectional view showing a structure of a board and a semiconductor module according to a tenth embodiment of the present invention.

FIG. 19 is a schematic cross-sectional view showing a structure of a board 10 and a semiconductor module 30 according to the tenth embodiment. The semiconductor module 30 is comprised of a board 10 and a semiconductor device 50 mounted on the board 10.

The board 10 includes an insulating resin layer 70, a wiring layer 14, a bump electrode 16, and a covering 18 which covers or coats a top surface of the bump electrode 16 and a region, at a side surface thereof, continuous with the top surface thereof excluding a region in contact with the wiring layer 14. A wiring protective layer 24 is provided on the surface of the wiring layer 14 opposite to the insulating resin layer 70. In an opening 24a, a solder bump 21 is formed on the wiring layer 14. The bump electrode 16 penetrates the insulating resin layer 70 and is electrically connected to an element electrode 52 provided in the semiconductor device 50.

The board 10 further includes another covering 90 which is discontinuous across the covering 18 and at least covers a part, extending from a base A, including the base A at which a side surface of the bump electrode 16 is in contact with a surface of the wiring layer 14. The base A is a boundary between the wiring layer 14 and the bump electrode 16, and the another covering 90 covers a region containing the base A. The another covering 90 may cover a region, on the wiring layer 14, adjacent to the base A.

The another covering 90 is a metal layer made of a metal material similar to the material constituting the covering 18. This metal layer is formed, by electrolytic plating or electroless plating, using a metal material having a yield stress which is, for example, greater than 40% of the yield stress of the bump electrode 16 and less than or equal to 100% of that of the bump electrode 16. Alternatively, the metal layer is a conductive paste layer formed by the use of a conductive paste. The metal layer may multilayered. For example, a Ni plating layer and an Au plating layer are stacked together. In the tenth embodiment, such a multilayer is a Ni/Au plating layer formed of gold (Au) and nickel (Ni) having 60% of the yield stress relative to the yield stress of the bump electrode 16 formed of copper. If the bump electrode 16 and the another covering 90 are formed of the same material, the bump electrode 16 and the another covering 90 may be formed integrally with each other. In such a case, the bump electrode 16 is of a shape having a stepped portion, disposed at a wiring layer side (at a base A side) closer than the covering 18, such that said stepped portion is thicker and extends to the wiring layer 14.

The semiconductor device 50 is press-bonded to the insulating resin layer 70 in a manner such that an electrode surface of the semiconductor device 50 provided with the element electrodes 52 is disposed toward an insulating resin layer 70 side. A protective layer 54 of the semiconductor device 50 is stacked on the semiconductor device 50.

(Manufacturing Method of Semiconductor Module)

FIGS. 20A to 20F are cross-sectional views showing a process in a method for forming bump electrodes 16, coverings 18 and another coverings 90.

Figure 20A:
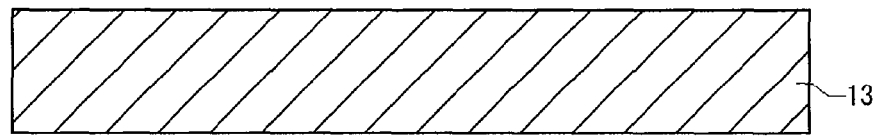
FIGS. 20A to 20F are cross-sectional views showing a process in a method for forming bump electrodes, coverings and another coverings.

As shown in FIG. 20A, a copper sheet 13 having the thickness at least larger than the sum of the height of the bump electrode 16 and the thickness of the wiring layer 14 is prepared.

Figure 20B:
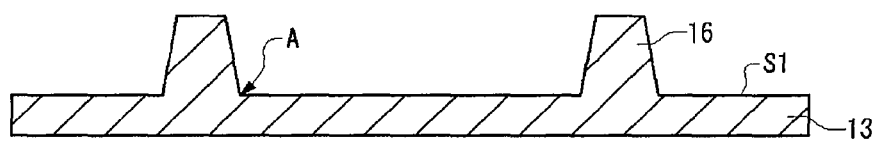

Then, as shown in FIG. 20B, a bump electrode 16 is formed on a main surface S1 of the copper sheet 13 by using a known photolithography method and an etching method. A portion where a surface of the copper sheet 13 and a side surface of the bump electrode 16 are in contact with each other corresponds to the base A.

Figure 20C:
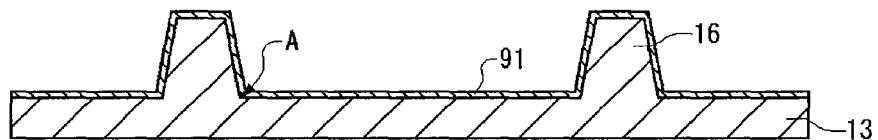

Then, as shown in FIG. 20C, a plating layer 91 is formed, by electrolytic plating, on a main surface of the copper sheet 13 where the bump electrode 16 has been formed.

Figure 20D:
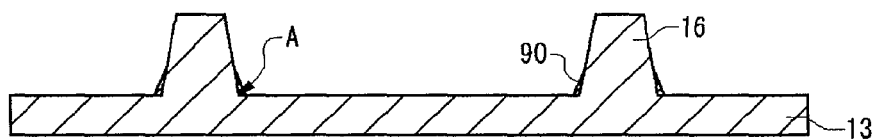

Then, as shown in FIG. 20D, another covering 90 is formed by a known anisotropic dry etching. Here, the etching direction of the anisotropic dry etching is set approximately vertical relative to the main surface of the copper sheet 13 where the bump electrode 16 is formed. Thereby, a plating layer stays on the base A due to a difference in layer thickness viewed from the etching direction, so that this residual layer becomes another covering 90.

Figure 20E:
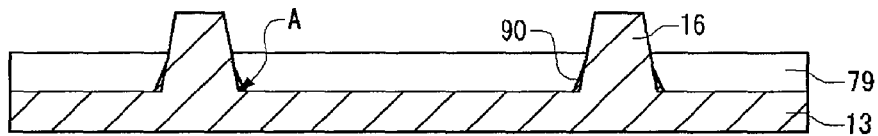

Next, as shown in FIG. 20E, a resist 79 is stacked on a main surface S1 of the copper sheet 13 where the bump electrode 16 has been formed, up to a predetermined height. The height of the stacked resist 79 corresponds to the height of a region coated with the covering 18.

Figure 20F:

Then, as shown in FIG. 20F, the covering 18 is formed on an exposed portion of the bump electrode 16 by electrolytic plating or electroless plating. After the formation of the covering 18, the resist 79 is removed. By employing the above-described process, bump electrodes 16, coverings 18 and another covering 90 are formed.

The bump electrode 16, the covering 18 and the another covering 90 may also be formed by following the procedure as shown in FIGS. 21A to 21E and FIGS. 22A to 22C. FIGS. 21A to 21E and FIGS. 22A to 22C are cross-sectional views showing a process in a method for forming bump electrodes 16, coverings 18 and another coverings 90.

Figure 21A:
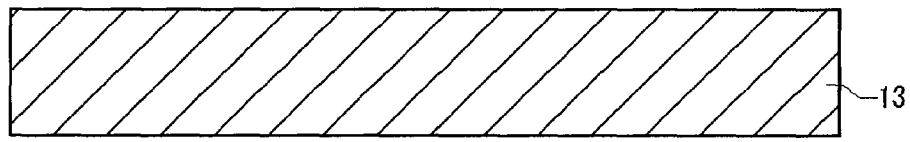
FIGS. 21A to 21E are cross-sectional views showing a process in a method for forming bump electrodes, coverings and another coverings.

As shown in FIG. 21A, a copper sheet 13 having the thickness at least larger than the sum of the height of the bump electrode 16 and the thickness of the wiring layer 14 is prepared.

Figure 21B:
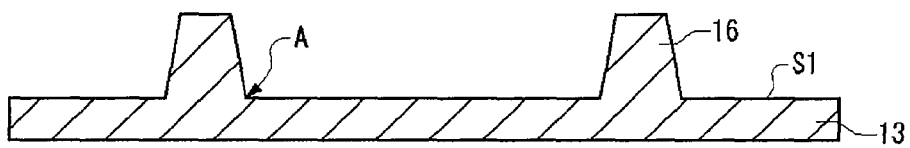

Then, as shown in FIG. 21B, a bump electrode 16 is formed on a main surface S1 of the copper sheet 13 by using a known photolithography method and an etching method.

Figure 21C:

Then, as shown in FIG. 21C, a resist 81 is formed on a region, excluding the area where the bump electrode 16 is formed, on a main surface of the copper sheet 13 where the bump electrode 16 has been formed, by a known photolithography method.

Figure 21D:
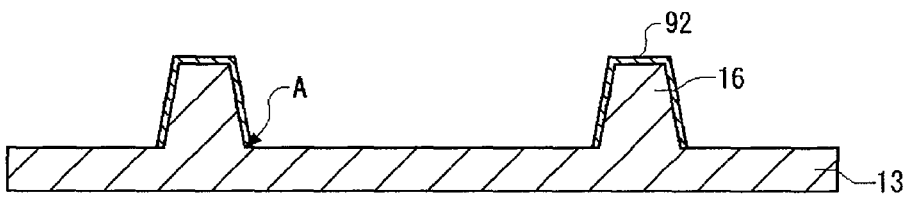

Then, as shown in FIG. 21D, the resist 81 is used as a mask and a plating layer 92 is formed on the surface of the bump electrode 16 by electrolytic plating, for instance. After the plating layer 92 has been formed, the resist 81 is removed.

Figure 21E:

Next, as shown in FIG. 21E, a resist 82 is stacked on a main surface of the copper sheet 13 where the bump electrode 16 has been formed, up to a predetermined height. The height of the resist 82 corresponds to the height of a region coated with the another covering 90.

Figure 22A:
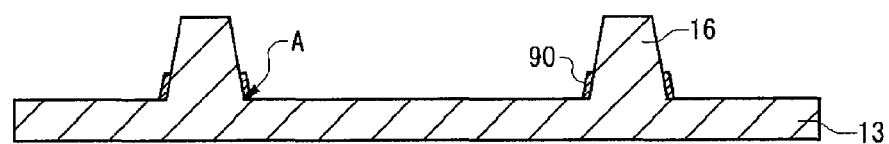
FIGS. 22A to 22C are cross-sectional views showing a process in a method for forming bump electrodes, coverings and another coverings.

Then, as shown in FIG. 22A, the resist 82 is used as a mask and a plating layer 92 is formed on the surface of the bump electrode 16 by a known etching method. After another covering 90 has been formed, the resist 82 is removed.

Figure 22B:
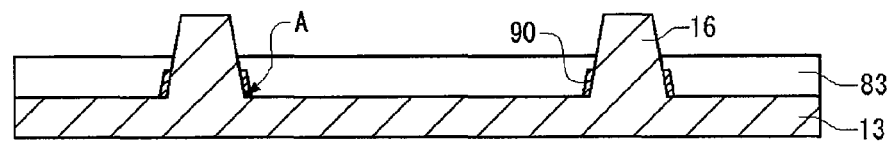

Then, as shown in FIG. 22B a resist 83 is stacked on the main surface of the copper sheet 13 where the bump electrode 16 has been formed, up to a predetermined height. The height of the resist 83 corresponds to the height of a region coated with the covering 18.

Figure 22C:
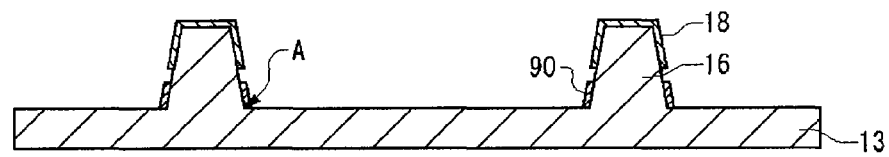

Next, as shown in FIG. 22C, the covering 18 is formed on an exposed region of the bump electrode 16 by electrolytic plating or electroless plating. After the covering 18 has been formed, the resist 83 is removed. By employing the above-described process, bump electrodes 16, coverings 18 and another coverings 90 are formed.

Figure 23:
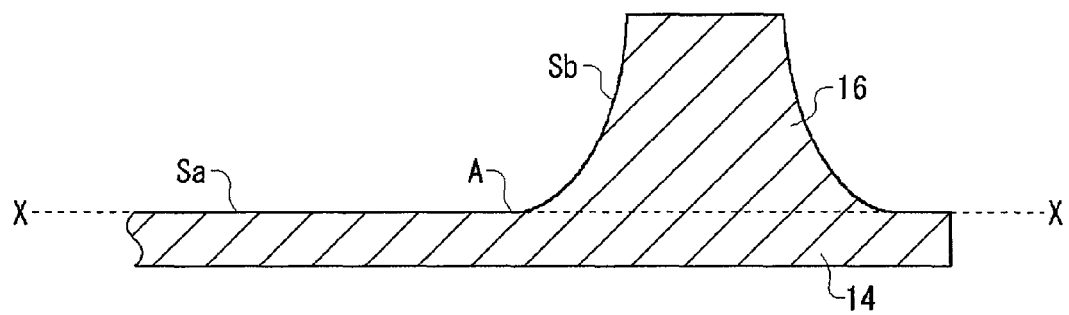
FIG. 23 illustrates the position of a base relative to a surface of a wiring layer and a side surface of a bump electrode.

Subsequently, similar to the first embodiment, a semiconductor module 30 is formed by following the procedure as shown in FIGS. 3A to 3D and FIGS. 4A and 4B. As shown in FIG. 23, suppose that the shape of a side surface of the bump electrode 16 is such that the curvature of the side surface of the bump electrode 16 continuously changes in an region that meets the wiring layer 14. Then the base A where the surface of the wiring layer 14 comes in contact with the side surface of the bump electrode 16 corresponds to a point or a line where a reference surface X having the same height as a surface Sa of the wiring layer 14, where the bump electrode 16 is provided, intersects with a side surface Sb of the bump electrode 16. As described above, if the surface Sa has fine asperities thereon, the surface Sa will be defined to be a surface that passes through the average height of these fine asperities.

A description is given hereunder of the advantageous effects achieved by the provision of the another covering 90.

Figure 24A:
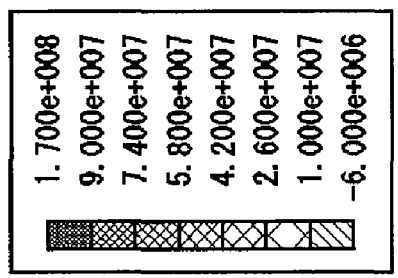
FIGS. 24A to 24C are schematic diagrams showing changes in stress distribution due to temperature change.
Figure 24A:
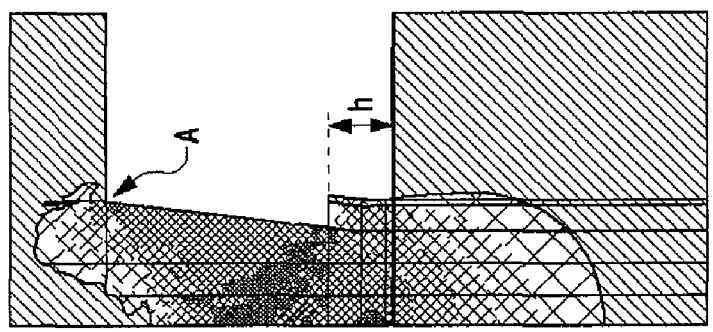
Figure 24B:
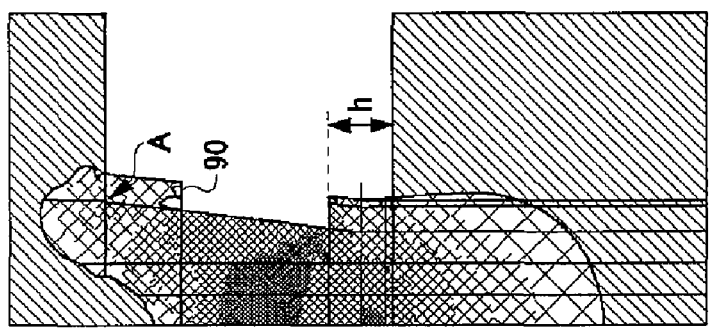
Figure 24C:
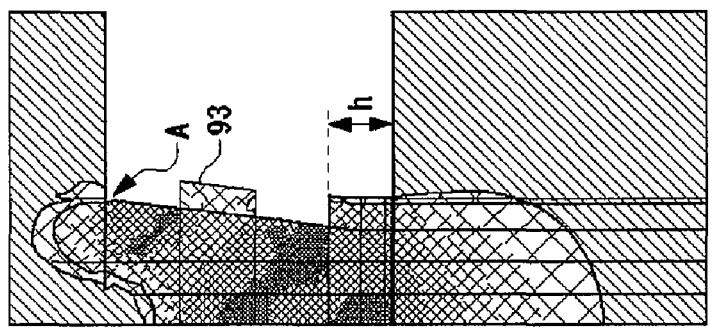

FIGS. 24A to 24C are schematic diagrams showing calculated distributions (by Finite Element Method) of the stress caused in an atmosphere where the temperature varies from 25° C. to 125° C., in the bump electrodes 16 where the covering 18 having the yield stress of 50% and the covering height h of 5 μm (which is ⅛ of the height of the bump electrode 16) and in the electrodes 16 with or without the another covering 90, respectively. FIG. 24A shows a stress distribution in a structure where coverings 18 only are provided on the bump electrodes 16. FIG. 24B shows a stress distribution in a structure where another coverings 90 as well as the coverings 18 are provided on the bump electrodes 16. FIG. 24C shows a stress distribution in a structure where coverings 18 are provided on the bump electrodes 16 and a metal layer 93, which is discontinuous across the covering 18, is provided in a region of a side surface of the bump electrode 16 excluding the base A.

As shown in FIG. 24A, the stress is concentrated on the bases A in the structure where coverings 18 only are provided. On the other hand, as shown in FIG. 24B, in the structure where another coverings 90 that cover the bases A of the bump electrode 16 are provided, the stress concentrated on the bases A is absorbed and reduced while the stress concentrated at the interface between the covering 18 and the element electrode 52 is absorbed and reduced. Therefore, the provision of another covering 90 in addition to the covering 18 in the bump electrode 16 can reduce the maximum stress occurring in the interface between the covering 18 and the element electrode 52 and also reduce the stress acting on the base A of the bump electrode 16.

As shown in FIG. 24C, in the structure where the metal layer 93, which is discontinuous across the covering 18, is provided in a region of a side surface of the bump electrode 16 excluding the base A, the stress concentrated on the base A is reduced but the stress at the interface between the covering 18 and the element electrode 52 increases. Referring to FIG. 24C, the stress is concentrated on a region near the base A of the bump electrode 16. From these facts, it can be safely concluded that the provision of another covering 90 which covers a region, including the base A, of the side surface of the bump electrode 16 can reduce the maximum stress occurring at the interface between the covering 18 and the element electrode 52 and also can reduce the stress acting on the base A of the bump electrode 16.

As described above, according to the tenth embodiment, the following advantageous effects are achieved in addition to those of the first embodiment. That is, by employing this tenth embodiment, another coverings which cover regions containing the bases are provided on the bump electrodes, so that the position where the stress caused by the temperature change is concentrated can be moved from the interface between the covering and the bump electrode to a bump electrode side. As a result, the maximum stress occurring at the interface can be made smaller and, at the same time, the concentration of the stress on the base can be absorbed and reduced. Thus, when the semiconductor device is mounted on the packaging board, the possibility of damaging the element electrodes is reduced and the possibility of cracks occurring in the bump electrodes is reduced, so that the connection reliability between the bump electrode and the element electrode is improved. Furthermore, the connection reliability between the board and the semiconductor device is further enhanced.

Eleventh Embodiment

Next, a description will be given of a mobile apparatus (portable device) provided with the semiconductor module according to each of the above-described embodiments. The mobile apparatus presented as an example herein is a mobile phone, but it may be any electronic apparatus, such as a personal digital assistant (PDA), a digital video cameras (DVC) and a digital still camera (DSC).

Figure 25:
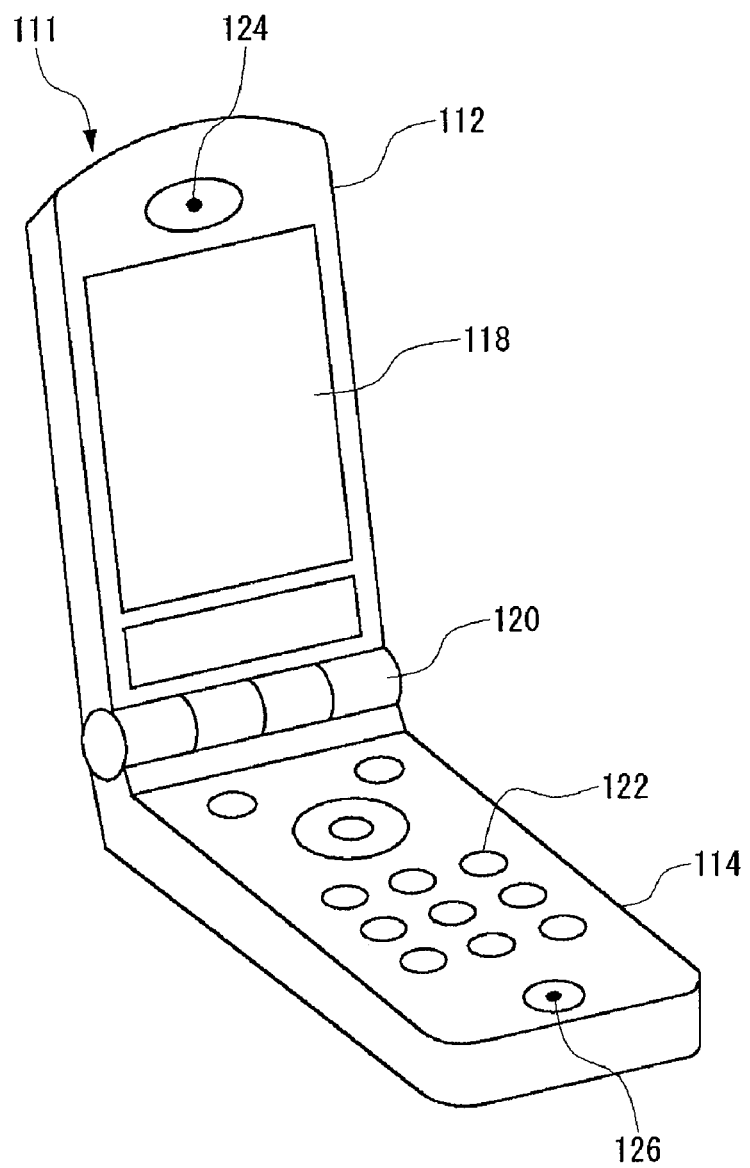
FIG. 25 illustrates a structure of a mobile phone according to an eleventh embodiment of the present invention.

FIG. 25 illustrates a structure of a mobile phone provided with a semiconductor module 30 according to each of the above-described embodiments. A mobile phone 111 has a structure including a first casing 112 and a second casing 114 jointed together by a movable part 120. The first casing 112 and the second casing 114 are turnable/rotatable around the movable part 120 as the axis. The first casing 112 is provided with a display unit 118 for displaying characters, images and other information and a speaker unit 124. The second casing 114 is provided with a control module 122 with operation buttons and the like and a microphone 126. Note that a semiconductor module according to each of the above-described embodiments is mounted within the mobile phone 111 such as this.

Figure 26:
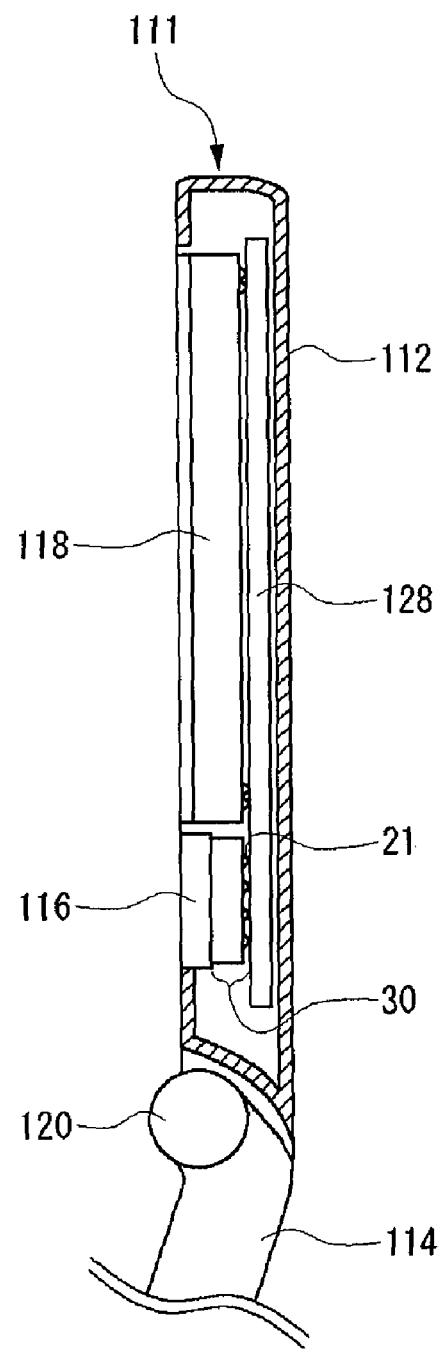
FIG. 26 is a partial cross-sectional view of a mobile phone shown in FIG. 25.

FIG. 26 is a partial cross-sectional view (cross-sectional view of the first casing 212) of the mobile phone shown in FIG. 25. A semiconductor module 30 according to each of the embodiments is mounted on a printed circuit board 128 via a solder bump 21, and is coupled electrically to a display unit 118 and the like by way of the printed circuit board 128. Also, a radiating substrate 116, such as a metal substrate, is provided on the back side of the semiconductor module 30 (opposite side of the solder bump 21), so that the heat generated from the semiconductor module 30, for example, can be efficiently released outside the first casing 112 without getting trapped inside the first casing 112.

By employing a portable device equipped with the semiconductor module 30 according to the eleventh embodiment, the connection reliability between the covering 18 and the element electrode 52 is improved and consequently the connection reliability within the semiconductor module 30 is improved. Hence, the reliability of a portable device on which such a semiconductor module 30 is mounted is improved.

The present invention has been described by referring to each of the above-described embodiments. However, the present invention is not limited to the above-described embodiments only, and various modifications, such as changes in design, are possible. The embodiments added with such modifications are also within the scope of the present invention.

For example, in each of the above-described embodiments, the wiring layer on the board is formed in a single layer or two layers but is not limited thereto and may be of a multilayer having three or more layers. Also, the solder bump is formed on the outermost face of the wiring layer. However, this should not be considered as limiting and, for example, a MOS transistor may be bonded to the wiring layer, and a source electrode, a drain electrode and a gate electrode of the MOS transistor may be electrically connected to the wiring layer.

A means for electrically connecting between different wiring layers through the medium of an insulating resin layer, which develops plastic flow under pressure, using the aforementioned bump electrodes can be applied to a process for fabricating semiconductor packages, which is called a wafer-level CSP (Chip Size Package) process. By employing such a technique, the semiconductor module can be made thinner and smaller.

While the preferred embodiments of the present invention and their modifications have been described using specific terms, such description is for illustrative purposes only, and it is to be understood that changes and variations may further be made without departing from the spirit or scope of the appended claims.

What is claimed is:

1. A board adapted to mount an electronic device, comprising:
   an insulating resin layer;
   a wiring layer provided on one surface of said insulating resin layer;
   a bump electrode formed so as to be integrated with the wiring layer, provided on an insulating-resin-layer-side surface of said wiring layer in an extension from the insulating-resin-layer-side surface of said wiring layer, and embedded in the insulating resin layer; and
   a covering, formed of a metal layer, which covers a top surface of said bump electrode and a region, at a side surface thereof, continuous with the top surface thereof excluding a region in contact with said wiring layer.

2. The board according to claim 1, further comprising another covering, formed of a metal layer, which is discontinuous across said covering and at least covers a part, extending from a base, including the base at which the side surface of said bump electrode is in contact with the surface of said wiring layer.

3. The board according to claim 1, wherein the metal layer has a yield stress which is greater than 40% of the yield stress of said bump electrode and less than or equal to 100% of that of said bump electrode.

4. The board according to claim 1, wherein the metal layer has a yield stress which is greater than or equal to 50% of the yield stress of said bump electrode and less than or equal to 75% of that of said bump electrode, and
   said covering covers a region occupying less than or equal to one half of the height of said bump electrode from the top surface thereof to a surface of said wiring layer at a side thereof where said bump electrode is provided.

5. A semiconductor module, comprising:
   a board according to claim 1;
   a semiconductor device including an element electrode disposed counter to the bump electrode of said board; and
   the insulating resin layer provided between the wiring layer and said semiconductor device,
   wherein the bump electrode penetrates said insulating resin layer, and
   the bump electrode and the element electrode are electrically connected to each other.

6. A semiconductor module according to claim 5, wherein said insulating resin layer develops plastic flow when pressurized.

7. A portable device which mounts a semiconductor module according to claim 5.

* * * * *